US 12,494,764 B2

(12) United States Patent
Gong et al.

(10) Patent No.: US 12,494,764 B2
(45) Date of Patent: Dec. 9, 2025

(54) RESONANT DEVICE AND ACOUSTIC FILTER

(71) Applicant: Spectron (Shenzhen) Technologies Co., Ltd., Guangdong (CN)

(72) Inventors: Songbin Gong, Guangdong (CN); Yansong Yang, Guangdong (CN)

(73) Assignee: SPECTRON (SHENZHEN) TECHNOLOGIES CO., LTD., Guangdong (CN)

(*) Notice: Subject to any disclaimer, the term of this patent is extended or adjusted under 35 U.S.C. 154(b) by 968 days.

(21) Appl. No.: 17/674,375

(22) Filed: Feb. 17, 2022

(65) Prior Publication Data

US 2022/0271731 A1 Aug. 25, 2022

(30) Foreign Application Priority Data

Feb. 20, 2021 (CN) .......................... 202110194135.6
Feb. 20, 2021 (CN) .......................... 202120382966.1

(51) Int. Cl.
*H03H 9/02* (2006.01)
*H03H 9/145* (2006.01)
*H03H 9/64* (2006.01)

(52) U.S. Cl.
CPC .... *H03H 9/02574* (2013.01); *H03H 9/02566* (2013.01); *H03H 9/02685* (2013.01); *H03H 9/14544* (2013.01); *H03H 9/6406* (2013.01)

(58) Field of Classification Search
CPC .......... H03H 9/02574; H03H 9/02566; H03H 9/02685; H03H 9/14544
USPC ...... 310/313 R, 313 A, 313 B, 313 C, 313 D
See application file for complete search history.

(56) References Cited

U.S. PATENT DOCUMENTS

| 6,246,149 | B1 | 6/2001 | Inoue et al. | |
| 6,259,186 | B1 | 7/2001 | Shibata et al. | |
| 6,316,861 | B1* | 11/2001 | Ballandras | H03H 9/02551 |
| | | | | 310/313 D |
| 2006/0152107 | A1* | 7/2006 | Tanaka | H03H 9/02551 |
| | | | | 310/313 R |

(Continued)

FOREIGN PATENT DOCUMENTS

| CN | 1894850 | 1/2007 |
| CN | 106575957 A | 4/2017 |
| CN | 107342748 | 11/2017 |

(Continued)

OTHER PUBLICATIONS

Translation of Official Action issued Oct. 24, 2024 in related Chinese Patent Application No. 202110194135.6, 14 pgs.

(Continued)

*Primary Examiner* — Derek J Rosenau
(74) *Attorney, Agent, or Firm* — NORTON ROSE FULBRIGHT US LLP

(57) ABSTRACT

Disclosed are a resonant device and an acoustic filter. The resonant device includes a wafer substrate, a piezoelectric layer and an interdigital electrode layer. The piezoelectric layer is located on a side of the wafer substrate and includes a piezoelectric monocrystal material, and the piezoelectric monocrystal material includes a first crystal axis, a second crystal axis and a third crystal axis perpendicular to each other. A direction of an electric field generated by the interdigital electrode layer in the piezoelectric layer is a device direction.

18 Claims, 11 Drawing Sheets

(56) References Cited

U.S. PATENT DOCUMENTS

2020/0028486 A1* 1/2020 Kishino .................. H03H 9/25
2020/0287515 A1   9/2020 Ito et al.

FOREIGN PATENT DOCUMENTS

| CN | 107636961 A | 1/2018 |
|---|---|---|
| CN | 110138356 A | 8/2019 |
| CN | 110445474 | 11/2019 |
| CN | 214256261 | 9/2021 |
| FR | 3079667 | 10/2019 |
| JP | 2007202087 | 8/2007 |
| JP | 2014039199 | 2/2014 |
| JP | 2019050544 | 3/2019 |
| WO | WO 2019082901 | 2/2019 |
| WO | 2019/185415 A1 | 10/2019 |

OTHER PUBLICATIONS

Translation of Official Action issued Jul. 9, 2024 in related Japanese Patent Application No. 2023-550300, 13 pgs.
Translation of Official Action issued Nov. 13, 2024 in related Korean Patent Application No. 10-2023-7032014, 13 pgs.
International Search Report in connection with International Application No. PCT/CN2021/091885.

* cited by examiner (a)

(b)

RESONANT DEVICE AND ACOUSTIC FILTER

CROSS-REFERENCE TO RELATED APPLICATION

This application claims priority to Chinese Patent Application No. 202110194135.6 filed with the CNIPA on Feb. 20, 2021, the disclosure of which is incorporated herein by reference in its entirety.

TECHNICAL FIELD

The present disclosure relates to the field of wireless communication and, in particular, a resonant device and an acoustic filter.

BACKGROUND

As an important part of wireless communication front-end, a radio frequency acoustic filter device has functions of frequency selection and suppression of interference signals. The radio frequency acoustic filter device with better performance can not only improve the sensitivity of a transmitter and reduce the spectrum occupation space of the transmitter, but also improve the signal-to-noise ratio of a transceiver and reduce the power consumption of mobile devices in the communication link. The radio frequency acoustic filter device consists of resonant devices.

The related resonant device is mainly a surface acoustic wave (SAW) resonant device and a bulk acoustic wave (BAW) resonant device. The SAW resonant device and the BAW resonant device have technical advantages and cost advantages in different frequency ranges. At present, to satisfy the requirement of mobile broadband and high data rate wireless applications, the modern communication standards are continuously developing towards the higher frequency and the wider bandwidth. The SAW resonant device and the BAW resonant device in the related art cannot satisfy the above standards.

For example, the SAW resonant device has an advantage of low cost, however, the working frequency of the SAW resonant device is relatively low. To increase the working frequency of the SAW resonant device, an electrode width of the SAW resonant device needs to be adjusted, so that the design of the SAW resonant device cannot take into account a power threshold, insertion loss and manufacturing cost of the SAW device at the same time, thus resulting in that the SAW resonant device with higher working frequency has either too high cost or insufficient performance. Although the BAW resonant device has advantages in performance and high frequency, the manufacturing process of the BAW resonant device is complex, thereby the manufacturing cost of the BAW resonant device is increased and the BAW resonant device is difficult to satisfy the requirement of the consumer electronics market.

SUMMARY

Embodiments of the present disclosure provide a resonant device and an acoustic filter to improve the working frequency and performance of the resonant device while ensuring the low manufacturing cost of the resonant device.

In a first aspect, an embodiment of the present disclosure provides a resonant device, which includes a wafer substrate, a piezoelectric layer and an interdigital electrode layer.

The piezoelectric layer is located on a side of the wafer substrate and includes a piezoelectric monocrystal material, and the piezoelectric monocrystal material includes a first crystal axis, a second crystal axis and a third crystal axis perpendicular to each other. The interdigital electrode layer is located a side of the piezoelectric layer facing away from the wafer substrate, and a direction of an electric field generated by the interdigital electrode layer in the piezoelectric layer is a device direction.

The first crystal axis is perpendicular to the wafer substrate, and an included angle between the device direction and the second crystal axis is an angle $\angle A1$, where $-30° \leq \angle A1 \leq 10°$; or the first crystal axis is perpendicular to the wafer substrate, and an included angle between the device direction and the second crystal axis is an angle $\angle A1$, where $170° \leq \angle A1 \leq 210°$; or an included angle between the second crystal axis and a direction perpendicular to the wafer substrate is an angle $\angle B1$, where $-20° \leq \angle B1 \leq 40°$, and an included angle between the device direction and the first crystal axis is an angle $\angle B2$, where $-20° \leq \angle B2 \leq 20°$.

In an embodiment, the first crystal axis is directed from the wafer substrate to the piezoelectric layer, and the device direction is rotated counterclockwise until an included angle between the device direction and the second crystal axis is the angle $\angle A1$.

In an embodiment, the first crystal axis is directed from the wafer substrate to the piezoelectric layer, and the device direction is rotated clockwise until an included angle between the device direction and the second crystal axis is the angle $\angle A1$.

In an embodiment, the first crystal axis is directed from the piezoelectric layer to the wafer substrate, and the device direction is rotated clockwise until an included angle between the device direction and the second crystal axis is the angle $\angle A1$.

In an embodiment, the first crystal axis is directed from the piezoelectric layer to the wafer substrate, and the device direction is rotated counterclockwise until an included angle between the device direction and the second crystal axis is the angle $\angle A1$.

In an embodiment, the second crystal axis includes a positive direction and a negative direction extending along opposite directions.

When the angle $\angle B1$ is equal to 0°, the positive direction of the second crystal axis is directed from the wafer substrate to the piezoelectric layer or from the piezoelectric layer to the wafer substrate, and the device direction is rotated clockwise until an included angle between the device direction and the first crystal axis is the angle $\angle B2$; or when the angle $\angle B1$ is equal to 0°, the positive direction of the second crystal axis is directed from the wafer substrate to the piezoelectric layer or from the piezoelectric layer to the wafer substrate, and the device direction is rotated counterclockwise until an included angle between the device direction and the first crystal axis is the angle $\angle B2$.

In an embodiment, a main positioning edge of the wafer substrate is located in a first direction.

An included angle between a propagation direction of an acoustic wave excited in the piezoelectric layer and the first direction is an angle $\angle C1$, wherein $-30° \leq \angle C1 \leq 30°$, and the acoustic wave is excited by the electric field generated by the interdigital electrode layer in the piezoelectric layer.

In an embodiment, the interdigital electrode layer includes multiple first interdigital electrodes and multiple second interdigital electrodes.

The multiple first interdigital electrodes are connected to a bus bar located on a first side of the interdigital electrode layer, and the multiple first interdigital electrodes extend from the first side of the interdigital electrode layer to a second side of the interdigital electrode layer along a second direction, where the first side is opposite to the second side.

The multiple second interdigital electrodes are connected to a bus bar located on the second side of the interdigital electrode layer, and the multiple second interdigital electrodes extend from the second side of the interdigital electrode layer to the first side of the interdigital electrode layer along the second direction.

Vertical projections of the multiple first interdigital electrodes on the piezoelectric layer alternate with vertical projections of the multiple second interdigital electrodes on the piezoelectric layer, and the multiple first interdigital electrodes and the multiple second interdigital electrodes are insulated from each other.

In an embodiment, the resonant device further includes a metal layer and acoustic gratings.

The metal layer is located on a side of the interdigital electrode layer facing away from the wafer substrate, and the metal layer covers at least a partial region of the bus bar on the first side of the interdigital electrode layer and covers at least a partial region of the bus bar on the second side of the interdigital electrode layer.

The acoustic gratings are located on the side of the piezoelectric layer facing away from the wafer substrate, and the acoustic gratings are respectively provided on two sides of the interdigital electrode layer along the second direction and are insulated from the interdigital electrode layer.

One of the acoustic gratings located on each of the two sides of the interdigital electrode layer includes multiple metal strips along the second direction.

A pitch between adjacent ones of the multiple metal strips is greater than 0.1 times a pitch between one of the multiple first interdigital electrodes and one of the multiple second interdigital electrodes, and is less than 10 times the pitch between the one of the multiple first interdigital electrodes and the one of the multiple second interdigital electrodes, wherein the one of the multiple first interdigital electrodes is adjacent to the one of the multiple second interdigital electrodes.

A width of each of the multiple metal strips in a third direction is greater than 0.1 times the pitch between the adjacent ones of the multiple metal strips and is less than 0.9 times the pitch between the adjacent ones of the multiple metal strips.

An interval between the interdigital electrode layer and one of the multiple metal strips which is adjacent to the interdigital electrode layer is greater than ⅛ times the pitch between the one of the multiple first interdigital electrodes and the one of the multiple second interdigital electrodes, and is less than 10 times the pitch between the one of the multiple first interdigital electrodes and the one of the multiple second interdigital electrodes, wherein the third direction is parallel to the wafer substrate and is perpendicular to the second direction.

In a second aspect, an embodiment of the present disclosure provides an acoustic filter including the resonant device described in the first aspect.

DETAILED DESCRIPTION

Figure 1:
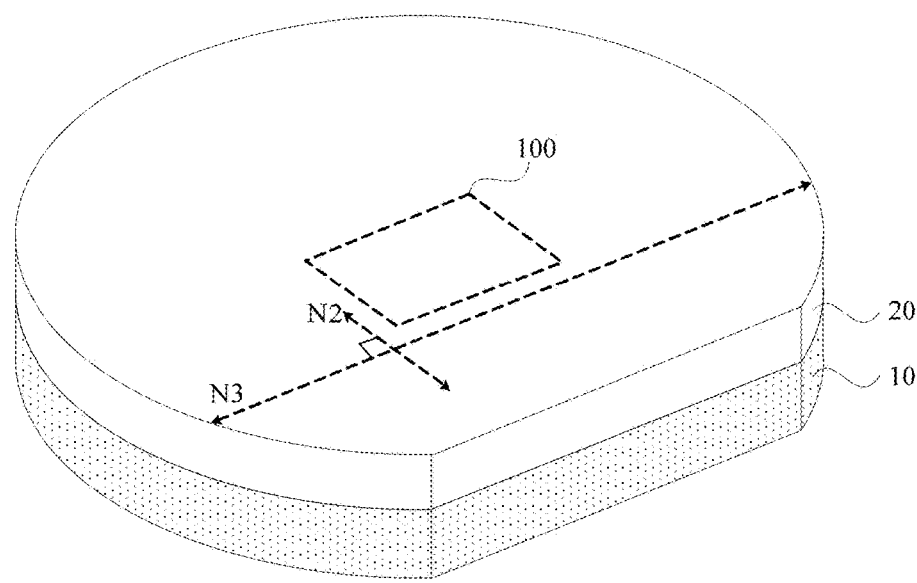
FIG. 1 is a structure view of a resonant device according to an embodiment of the present disclosure.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Figure 2:
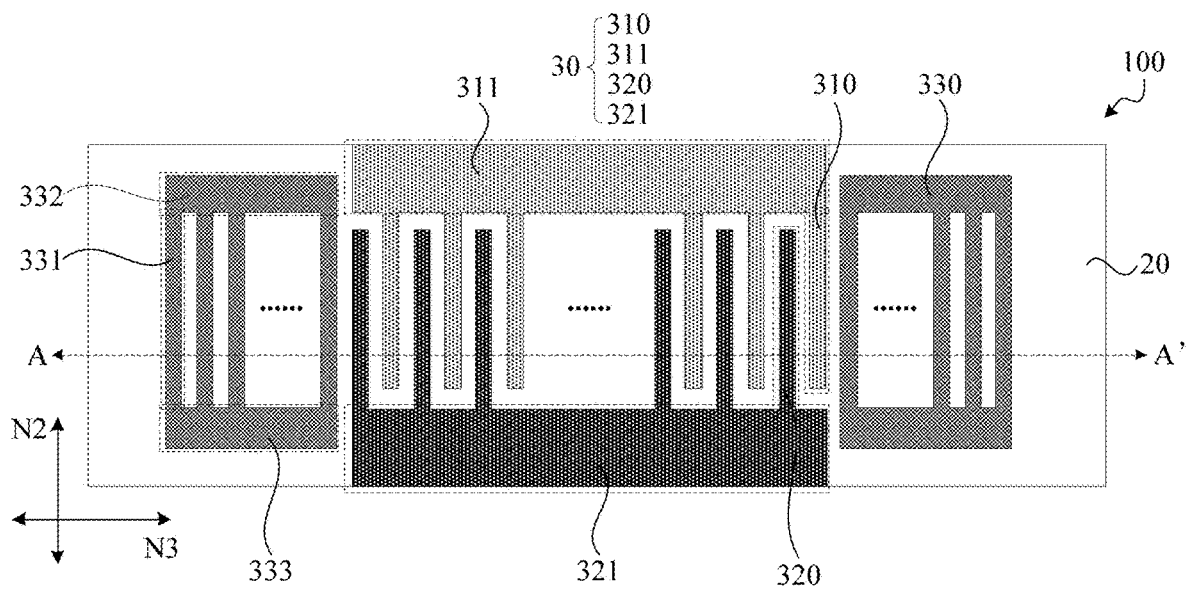
FIG. 2 is a top view of a resonant device according to an embodiment of the present disclosure.
Figure 3:
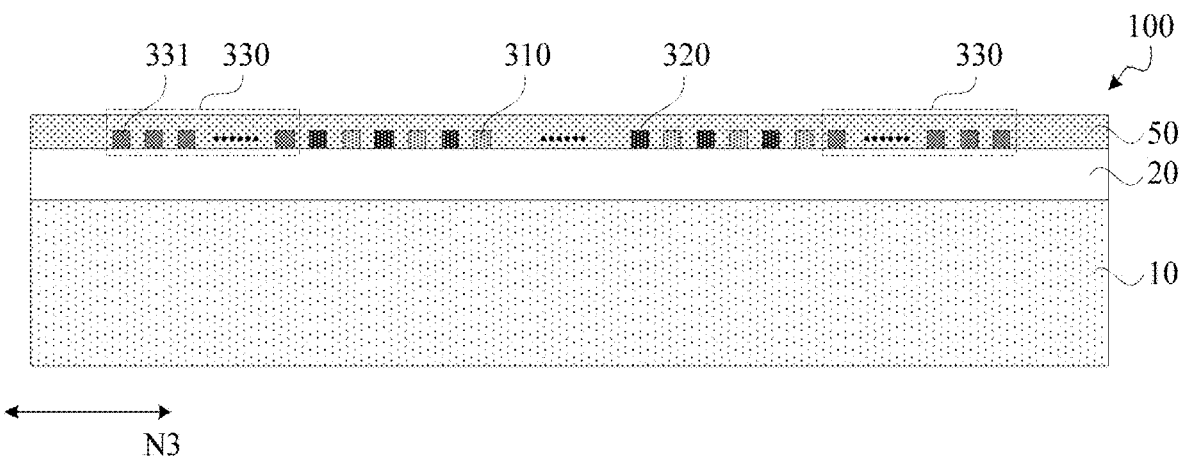
FIG. 3 is a sectional view of a resonant device according to an embodiment of the present disclosure.
Figure 4:
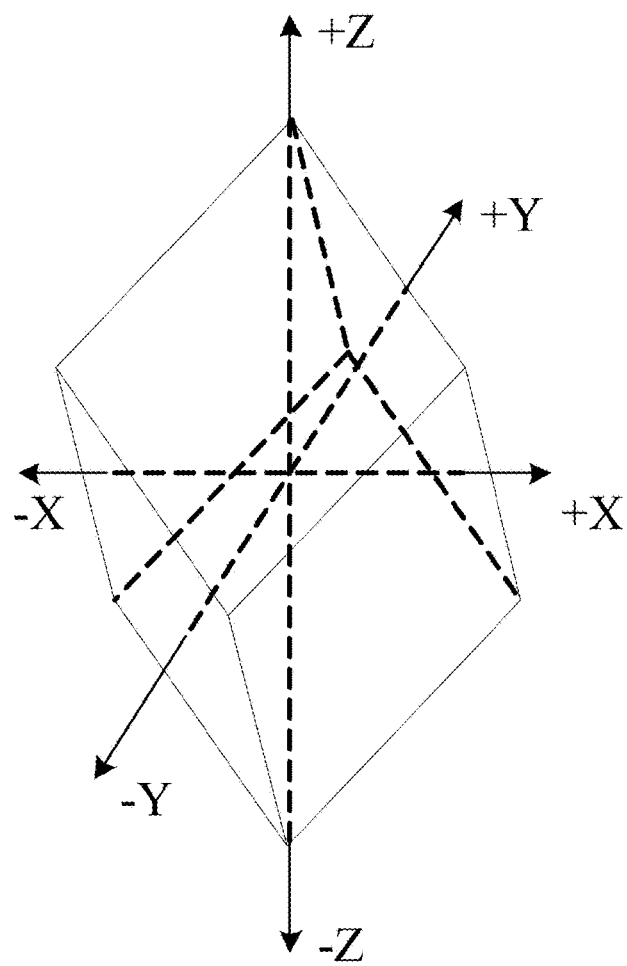
FIG. 4 is a structure view of a piezoelectric monocrystal material according to an embodiment of the present disclosure.

The embodiment of the present disclosure provides a resonant device, and FIG. 1 is a structure view of a resonant device according to an embodiment of the present disclosure and is specifically a side view of a wafer-level resonant device. FIG. 1 merely schematically illustrates a wafer substrate 10 and a piezoelectric layer 20 of the wafer-level resonant device, and the wafer-level resonant device may include multiple resonant devices, one of the multiple resonant devices 100 being exemplarily shown in FIG. 1. FIG. 2 is a top view of a resonant device according to an embodiment of the present disclosure and is specifically a top view of the resonant device 100 in FIG. 1. FIG. 3 is a sectional view of a resonant device according to an embodiment of the present disclosure and is specifically a sectional view of the resonant device shown in FIG. 2 taken along a line AA'. FIG. 4 is a structure view of a piezoelectric monocrystal material according to an embodiment of the present disclosure.

Referring to and in conjunction with FIGS. 1 to 4, the resonant device 100 provided in the embodiment of the present disclosure includes a wafer substrate 10, a piezoelectric layer 20 and an interdigital electrode layer 30. The piezoelectric layer 20 is located on a side of the wafer substrate 10 and includes a piezoelectric monocrystal material, and the piezoelectric monocrystal material includes a first crystal axis X, a second crystal axis Y and a third crystal axis Z, which are perpendicular to each other. The interdigital electrode layer 30 is located a side of the piezoelectric layer 20 facing away from the wafer substrate 10, and a direction of an electric field generated by the interdigital electrode layer 30 in the piezoelectric layer 20 is a device direction N3. The first crystal axis X is perpendicular to the wafer substrate 10, and an included angle between the device direction N3 and the second crystal axis Y is an angle $\angle A1$, where $-30°\leq\angle A1\leq10°$; or the first crystal axis X is perpendicular to the wafer substrate 10, and an included angle between the device direction N3 and the second crystal axis Y is an angle $\angle A1$, where $170°\leq\angle A1\leq210°$; or an included angle between the second crystal axis Y and a direction perpendicular to the wafer substrate 10 is an angle $\angle B1$, where $-20°\leq\angle B1\leq40°$, and an included angle between the device direction N3 and the first crystal axis X is an angle $\angle B2$, where $-20°\leq\angle B2\leq20°$.

Specifically, a material of the wafer substrate 10 may be sapphire. The wafer substrate 10 can provide supporting, buffering, protecting and the like for the resonant device. Various film layers in the resonant device may be sequentially formed on the wafer substrate 10 to form the wafer-level resonant device including the multiple resonant devices, and after forming the wafer-level resonant device, the resonant devices 100 may be obtained by cutting the wafer-level resonant device.

The piezoelectric layer 20 may be composed of multiple piezoelectric monocrystal materials arranged in a certain rule, and the piezoelectric monocrystal materials refer to monocrystal materials having a piezoelectric effect. Under the action of electric fields, mechanical stress will be generated in the piezoelectric monocrystal materials, and the piezoelectric monocrystal materials are correspondingly deformed due to the mechanical stress. In the embodiment, a material of the piezoelectric layer 20 may be at least one of lithium niobate, lithium tantalate or aluminium nitride.

Crystal structures have three-dimensional periodicity in spatial arrangement, and each type of crystal structures has a corresponding crystal axis coordinate system including three crystal axes. In the embodiment, merely the crystal structure of the trigonal system piezoelectric monocrystal material shown in FIG. 4 will be described schematically, which is not intended to limit the type of a crystal structure of the piezoelectric monocrystal material. Exemplarily, the piezoelectric monocrystal material shown in FIG. 4 may be any one of lithium niobate, lithium tantalate or aluminium nitride. In the crystal structure of the piezoelectric monocrystal material, each crystal axis includes a positive direction and a negative direction extending along opposite directions. The positive direction of the first crystal axis X is (+X) and the negative direction of the first crystal axis X is (−X); the positive direction of the second crystal axis Y is (+Y) and the negative direction of the second crystal axis Y is (−Y); and the positive direction of the third crystal axis Z is (+Z) and the negative direction of the third crystal axis Z is (−Z). The third crystal axis Z may be located on a relative long body diagonal of the crystal. A midpoint of the body diagonal may be an origin of coordinates. The first crystal axis X, the second crystal axis Y and the third crystal axis Z follow the right-hand rule, are at 90° to each other and are perpendicular to each other. A plane where the first crystal axis X and the second crystal axis Y are located can be obtained by taking a plane perpendicular to the third crystal axis Z.

The interdigital electrode layer 30 may include two groups of interdigital electrodes extending along the second direction N2, and the two groups of interdigital electrodes forms a metal electrode pattern on the piezoelectric layer 20 in a manner similar to that when two hands are parallel to the piezoelectric layer 20 and vertical projections of the two hands on the piezoelectric layer 20 do not overlap, palms of the two hands are oppositely disposed and fingers of the two hands cross each other. When electrical signals (such as power voltage signals) are provided to the two groups of interdigital electrodes, the two groups of interdigital electrodes will induce an electric field parallel to the wafer substrate 10 and perpendicular to the second direction N2 in a space close to the piezoelectric layer 20 and in the piezoelectric layer, that is, an electric field parallel to the wafer substrate 10 and perpendicular to the second direction N2 is generated in the entire thickness direction of the piezoelectric layer 20. In the embodiment, for ease of explanation, a direction of the electric field generated in the piezoelectric layer 20 by the two groups of interdigital electrodes is defined as the device direction N3.

When the electric field parallel to the wafer substrate 10 and perpendicular to the second direction N2 is generated in the entire thickness direction of the piezoelectric layer 20, the piezoelectric monocrystal material is correspondingly deformed under the action of the electric field, so that a surface acoustic wave propagating along a direction parallel to the wafer substrate 10 and perpendicular to the second direction N2 is excited in the piezoelectric layer 20. If the second direction N2 (i.e., an extending direction of the multiple interdigital electrodes) is defined as a longitudinal direction and a direction perpendicular to the second direction N2 (i.e., a direction perpendicular to the extending direction of the multiple interdigital electrodes, also i.e., the device direction N3) is defined as a transverse direction, the piezoelectric monocrystal material is polarized by a transverse electric field in the piezoelectric layer 20, and a polarization direction of the surface acoustic wave propagating in the piezoelectric layer 20 is the longitudinal direction, i.e., an acoustic wave polarized in the longitudinal direction. Finally, the surface acoustic wave is converted into corresponding electrical signal and output, and the resonant device completes filtering work.

Based on the above in the solution of the present embodiment, various film layers (i.e., the wafer substrate 10, the piezoelectric layer 20, and the interdigital electrode layer 30) of the resonant device are bonded in a specific manner, that is, the piezoelectric layer 20 is formed on the wafer substrate 10 such that the piezoelectric monocrystal material of the piezoelectric layer 20 is bonded to the wafer substrate 10 by a specific bonding manner, and the device direction N3 of the interdigital electrode layer 30 has a specific arrangement with respect to the piezoelectric monocrystal material of the piezoelectric layer 20, which is described in detail below.

Figure 5:
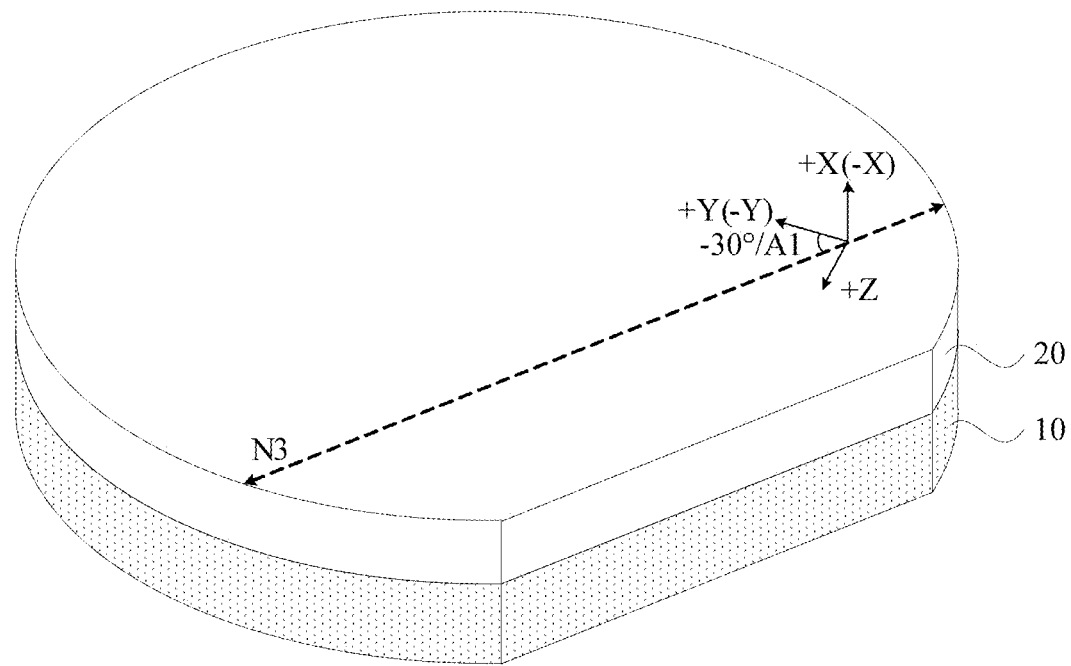
FIG. 5 is a structure view of combination between various film layers of a resonant device according to an embodiment of the present disclosure.
Figure 6:
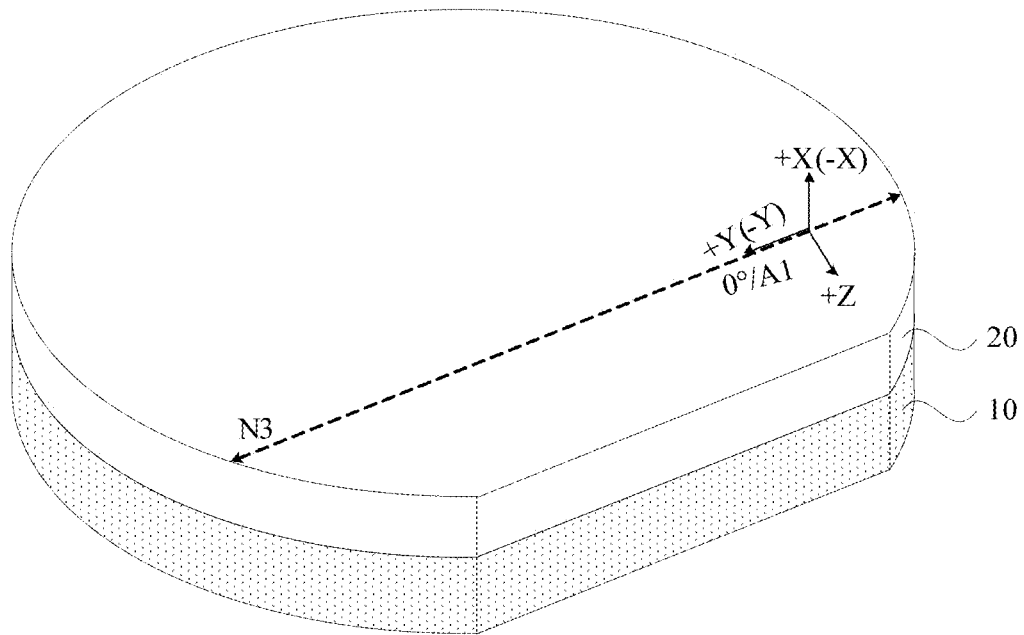
FIG. 6 is a structure view of combination between various film layers of another resonant device according to an embodiment of the present disclosure.
Figure 7:
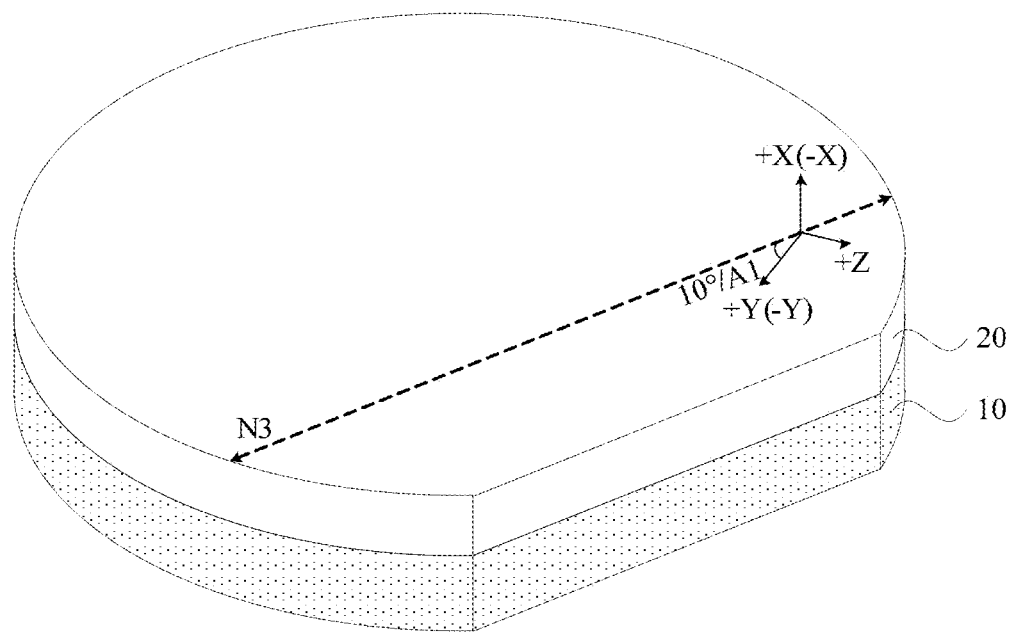
FIG. 7 is a structure view of combination between various film layers of another resonant device according to an embodiment of the present disclosure.

One: The first crystal axis X is perpendicular to the wafer substrate 10, and the included angle between the device direction N3 and the second crystal axis Y is the angle ∠A1, where −30°≤∠A1≤10°. In this case, the piezoelectric layer 20 and the wafer substrate 10 are bonded such that the first crystal axis X of the piezoelectric monocrystal material is perpendicular to the wafer substrate 10 (for example, the positive direction (+X) of the first crystal axis X is directed from the wafer substrate 10 to the piezoelectric layer 20 or the negative direction (−X) of the first crystal axis X is directed from the piezoelectric layer 20 to the wafer substrate 10), and the interdigital electrode layer 30 and the piezoelectric layer 20 are disposed such that the included angle between the device direction N3 and the second crystal axis Y of the piezoelectric monocrystal material is −30° to 10° (for example, −25°, −20°, −15° or −10°). Exemplarily, FIG. 5 is a structure view of combination between various film layers of a resonant device according to an embodiment of the present disclosure. In FIG. 5, the first crystal axis X is perpendicular to the wafer substrate 10, and the included angle between the device direction N3 and the second crystal axis Y of the piezoelectric monocrystal material is the angle ∠A1, where the angle ∠A1 is equal to −30°. FIG. 6 is a structure view of combination between various film layers of another resonant device according to an embodiment of the present disclosure. In FIG. 6, the first crystal axis X is perpendicular to the wafer substrate 10, and the included angle between the device direction N3 and the second crystal axis Y of the piezoelectric monocrystal material is the angle ∠A1, where the angle ∠A1 is equal to 0°. FIG. 7 is a structure view of combination between various film layers of another resonant device according to an embodiment of the present disclosure. In FIG. 7, the first crystal axis X is perpendicular to the wafer substrate 10, and the included angle between the device direction N3 and the second crystal axis Y of the piezoelectric monocrystal material is the angle ∠A1, where the angle ∠A1 is equal to 10°.

Figure 8:
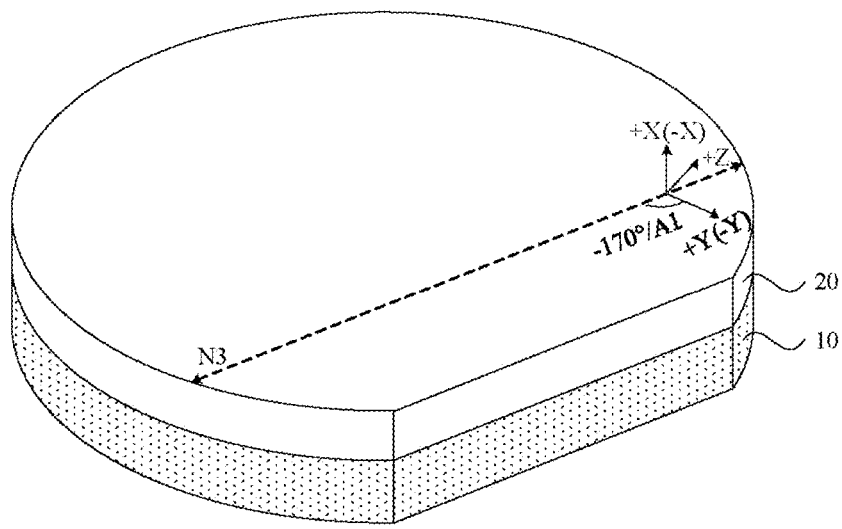
FIG. 8 is a structure view of combination between various film layers of another resonant device according to an embodiment of the present disclosure.

Two: The first crystal axis X is perpendicular to the wafer substrate 10, and the included angle between the device direction N3 and the second crystal axis Y is the angle ∠A1, where 170°≤∠A1≤210°. In this case, the piezoelectric layer 20 and the wafer substrate 10 are bonded such that the first crystal axis X of the piezoelectric monocrystal material is perpendicular to the wafer substrate 10, and the interdigital electrode layer 30 and the piezoelectric layer 20 are disposed such that the included angle between the device direction N3 and the second crystal axis Y of the piezoelectric monocrystal material is 170° to 210° (for example, 180°, 190° or 210°). Exemplarily, FIG. 8 is a structure view of combination between various film layers of another resonant device according to an embodiment of the present disclosure. In FIG. 8, the first crystal axis X is perpendicular to the wafer substrate 10, and the included angle between the device direction N3 and the second crystal axis Y of the piezoelectric monocrystal material is the angle ∠A1, where the angle ∠A1 is equal to 170°.

Figure 9:
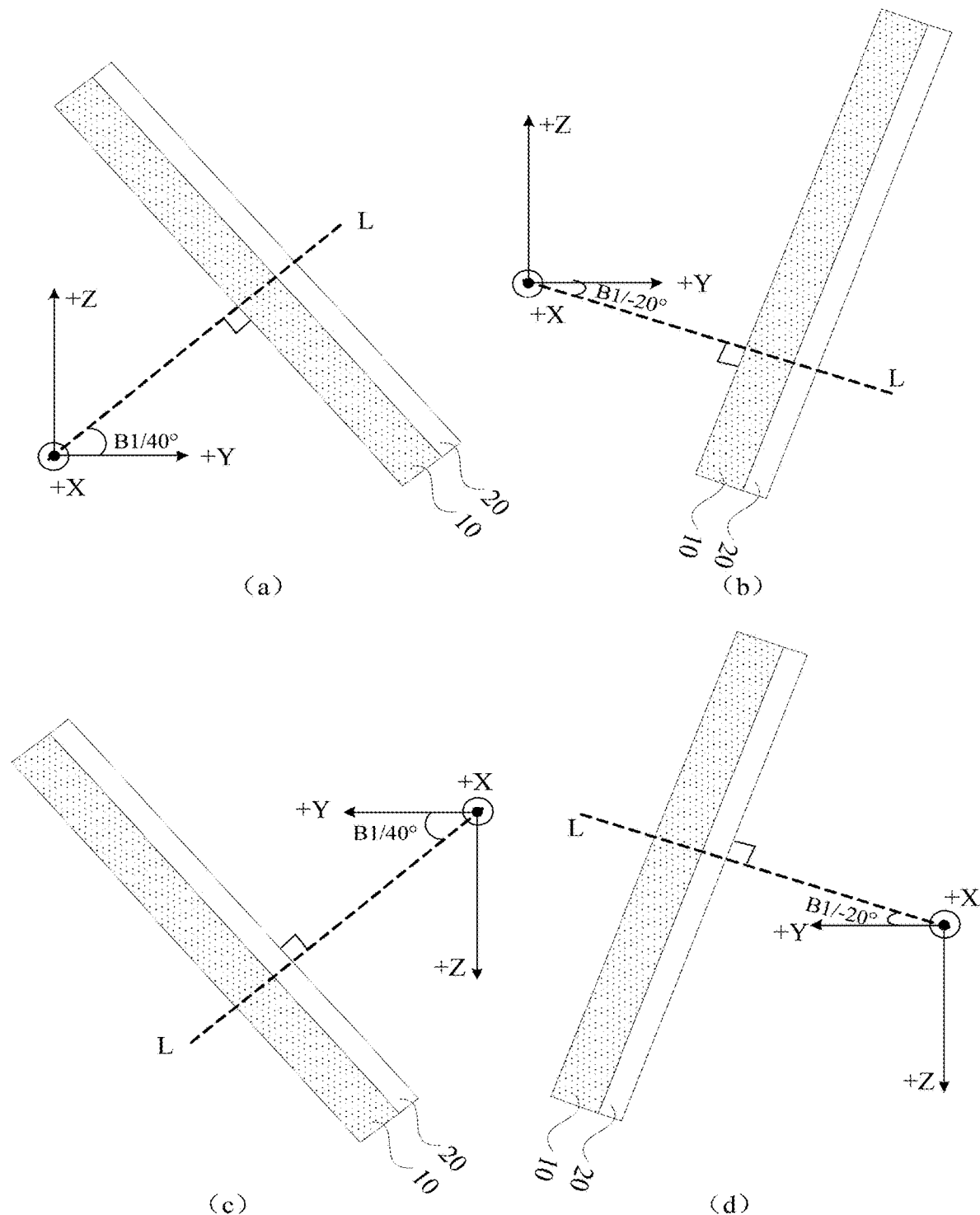
FIG. 9 is a structure view of combination between a piezoelectric layer and a wafer substrate of a resonant device according to an embodiment of the present disclosure.
Figure 10:
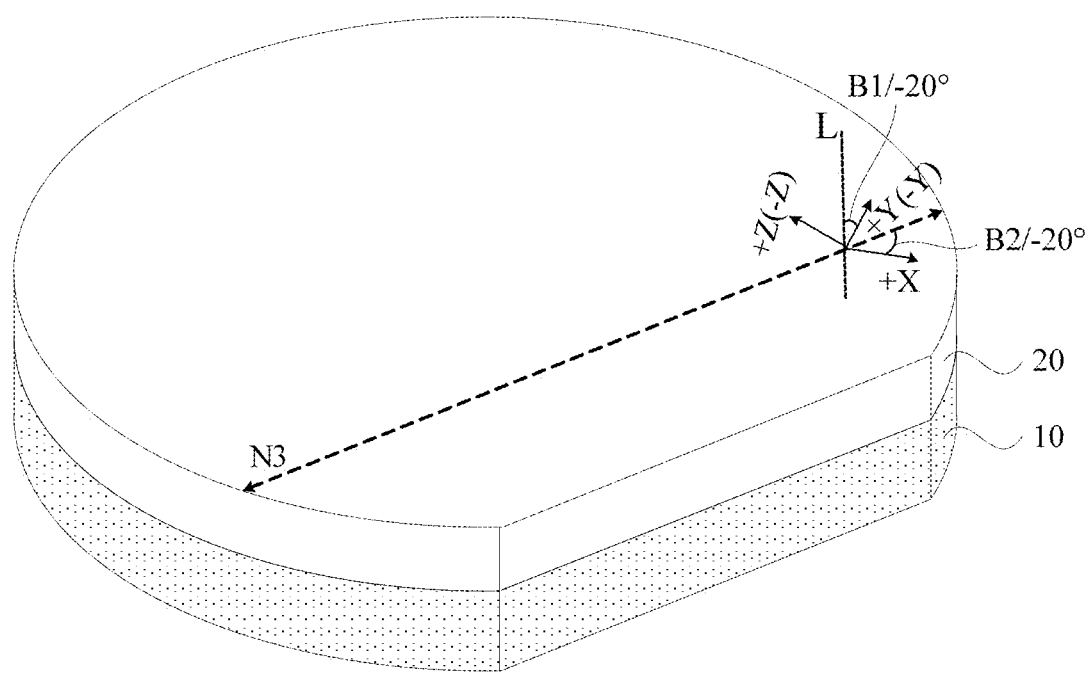
FIG. 10 is a structure view of combination between various film layers of another resonant device according to an embodiment of the present disclosure.
Figure 10:
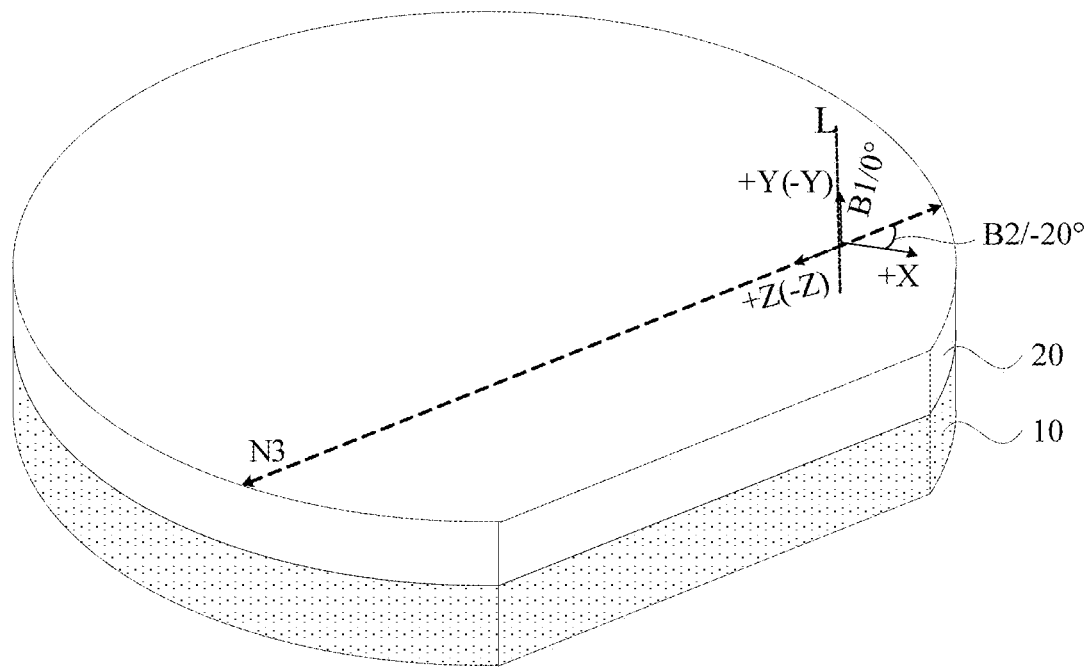

Three: The included angle between the second crystal axis Y and the direction perpendicular to the wafer substrate 10 is the angle ∠B1, where −20°≤∠B1≤40°, and the included angle between the device direction N3 and the first crystal axis X is the angle ∠B2, where −20°≤∠B2≤20°. In this case, the piezoelectric layer 20 and the wafer substrate 10 are bonded such that the included angle between the second crystal axis Y of the piezoelectric monocrystal material and the direction perpendicular to the wafer substrate 10 is −20° to 40° (for example, −10°, 0°, 10°, 20° or 30°), and the interdigital electrode layer 30 and the piezoelectric layer 20 are disposed such that the included angle between the device direction N3 and the first crystal axis X of the piezoelectric monocrystal material is −20° to 20° (for example, −10°, 0° or) 10°. Exemplarily, FIG. 9 is a structure view of combination between a piezoelectric layer and a wafer substrate of a resonant device according to an embodiment of the present disclosure. In FIG. 9 (a), an included angle between the positive direction (+Y) of the second crystal axis Y of the piezoelectric monocrystal material and the direction L perpendicular to the wafer substrate 10 is the angle ∠B1, where the angle ∠B1 is equal to 40°, and the direction L perpendicular to the wafer substrate 10 is directed from the wafer substrate 10 to the piezoelectric layer 20. In FIG. 9 (b), an included angle between the positive direction (+Y) of the second crystal axis Y of the piezoelectric monocrystal material and the direction L perpendicular to the wafer substrate 10 is the angle ∠B1, where the angle ∠B1 is equal to −20°, and the direction L perpendicular to the wafer substrate 10 is directed from the wafer substrate 10 to the piezoelectric layer 20. In FIG. 9 (c), an included angle between the positive direction (+Y) of the second crystal axis Y of the piezoelectric monocrystal material and the direction L perpendicular to the wafer substrate 10 is the angle ∠B1, where the angle ∠B1 is equal to 40°, and the direction L perpendicular to the wafer substrate 10 is directed from the piezoelectric layer 20 to the wafer substrate 10. In FIG. 9 (d), an included angle between the positive direction (+Y) of the second crystal axis Y of the piezoelectric monocrystal material and the direction L perpendicular to the wafer substrate 10 is the angle ∠B1, where the angle ∠B1 is equal to −20°, and the direction L perpendicular to the wafer substrate 10 is directed from the piezoelectric layer 20 to the wafer substrate 10. As can be seen from FIG. 9, in the embodiment, the piezoelectric monocrystal material of the piezoelectric layer 20 can be formed on a surface of the wafer substrate 10 in a variety of different bonding manners. FIG. 10 is a structure view of combination between various film layers of another resonant device according to an embodiment of the present disclosure. In FIG. 10 (a), the included angle between the second crystal axis Y of the piezoelectric monocrystal material and a direction perpendicular to the wafer substrate 10 is the angle ∠B1, where the angle ∠B1 is equal to −20°, and the included angle between the device direction N3 and the first crystal axis X of the piezoelectric monocrystal material is the angle ∠B2, where the angle ∠B2 is equal to −20°.

The embodiment improves the working frequency and performance of the resonant device by the combination manners between various film layers (i.e., the wafer substrate 10, the piezoelectric layer 20, and the interdigital electrode layer 30) of the above-mentioned resonant device. The principle is described below.

The wave speed of acoustic wave propagating in a solid material depends on the bulk elastic modulus of the solid material and density of the solid material, and the greater a ratio of the bulk elastic modulus to the density, the greater the wave speed. The ratio of the bulk elastic modulus to the density of the sapphire wafer substrate 10 is extremely high, and the bulk elastic modulus of the piezoelectric monocrystal material has anisotropy (values of the bulk elastic modulus are different in respective lattice directions). The maximum bulk elastic modulus of the piezoelectric monocrystal material can be utilized by the bonding manners between the sapphire wafer substrate 10 and the piezoelectric monocrystal material described above, that is, the combination manners described above. Therefore, with the several combination manners described above, the embodiment greatly improves the wave speed of the surface acoustic wave propagating in the resonant device, especially the wave speed of the surface acoustic wave propagating in the wafer substrate 10 and the piezoelectric layer 20.

f=v/(2*Wpi), where f is the working frequency of the resonant device, v is the wave speed of the surface acoustic wave propagating in the resonant device, and Wpi is the pitch between the interdigital electrodes. Therefore, in the embodiment, the working frequency of the resonant device is increased by increasing the wave speed v of the surface acoustic wave propagating in the wafer substrate 10 and the piezoelectric layer 20 without changing the pitch between the interdigital electrodes. Meanwhile, since the embodiment can improve the working frequency of the resonant device merely under the condition that the above-mentioned combination manners are set, the pitch between the interdigital electrodes need not to be changed and the electrode width of the resonant device need not to be adjusted, so that the low manufacturing cost of the resonant device is ensured. In addition, the piezoelectric layer 20 is bonded to the wafer substrate 10 in the above-mentioned specific directions, so that a relative small angle between a placement direction of the resonant device and a main positioning edge of the wafer substrate 10 is formed, which is beneficial to maximizing the utilization rate of the wafer substrate 10.

Since the piezoelectric monocrystal material has a characteristic of anisotropy, the piezoelectric layer 20 is bonded to the wafer substrate 10 in the above-mentioned specific directions to adjust the geometric shape and structure inside the resonant device, which is also helpful to enhancing the piezoelectric effect generated by the piezoelectric layer 20 and improving the electromechanical coupling coefficient of the resonant device, thereby enhancing the performance of the resonant device.

In conclusion, according to the solution of the embodiment of the disclosure, the technical problems that both the SAW resonant device and the BAW resonant device in the related art cannot give consideration to the low manufacturing cost, high working frequency and performance of the resonant device at the same time are solved, and the working frequency and performance of the resonant device are improved while ensuring the low manufacturing cost of the resonant device, thus being beneficial to satisfying the requirements of 5G communication standards.

The combination manners in the above cases of various film layers (i.e., the wafer substrate 10, the piezoelectric layer 20, and the interdigital electrode layer 30) of the resonant device are further refined.

Optionally, the first crystal axis X is directed from the wafer substrate 10 to the piezoelectric layer 20, and the device direction N3 is rotated counterclockwise until an included angle between the device direction N3 and the second crystal axis Y is the angle ∠A1.

Specifically, this manner is to refine the above case (one), the first crystal axis X of the piezoelectric monocrystal material is directed to outer of the plane where the wafer substrate 10 is located, and the device direction N3 may be rotated counterclockwise until an included angle between the device direction N3 and the second crystal axis Y of the piezoelectric monocrystal material is -30° to 10°. Exemplarily, referring to FIG. 7, the first crystal axis X of the piezoelectric monocrystal material is directed to outer of the plane where the wafer substrate 10 is located, and the device direction N3 is rotated counterclockwise until the included angle between the device direction N3 and the second crystal axis Y of the piezoelectric monocrystal material is the angle ∠A1, where the angle is equal to 10°.

Optionally, the first crystal axis X is directed from the wafer substrate 10 to the piezoelectric layer 20, and the device direction N3 is rotated clockwise until an included angle between the device direction N3 and the second crystal axis Y is the angle ∠A1.

Specifically, this manner is to refine the above case (two), the first crystal axis X of the piezoelectric monocrystal material is directed to outer of the plane where the wafer substrate 10 is located, and the device direction N3 may be rotated clockwise until an included angle between the device direction N3 and the second crystal axis Y of the piezoelectric monocrystal material is 170° to 210°.

Optionally, the first crystal axis X is directed from the piezoelectric layer 20 to the wafer substrate 10, and the device direction N3 is rotated clockwise until an included angle between the device direction N3 and the second crystal axis Y is the angle ∠A1.

Specifically, this manner is to refine the above case (one), the first crystal axis X of the piezoelectric monocrystal material is directed to inner of the plane where the wafer substrate 10 is located, and the device direction N3 may be rotated clockwise until an included angle between the device direction N3 and the second crystal axis Y of the piezoelectric monocrystal material is -30° to 10°. Exemplarily, referring to FIG. 5, the first crystal axis X of the piezoelectric monocrystal material is directed to inner of the plane where the wafer substrate 10 is located, and the device direction N3 is rotated clockwise until the included angle between the device direction N3 and the second crystal axis Y of the piezoelectric monocrystal material is the angle ∠A1, where the angle/A1 is equal to -30°.

Optionally, the first crystal axis X is directed from the piezoelectric layer 20 to the wafer substrate 10, and the device direction N3 is rotated counterclockwise until an included angle between the device direction N3 and the second crystal axis Y is the angle ∠A1.

Specifically, this manner is to refine the above case (two), the first crystal axis X of the piezoelectric monocrystal material is directed to inner of the plane where the wafer substrate 10 is located, and the device direction N3 may be rotated counterclockwise until an included angle between the device direction N3 and the second crystal axis Y of the piezoelectric monocrystal material is 170° to 210°. Exemplarily, referring to FIG. 8, the first crystal axis X of the piezoelectric monocrystal material is directed to inner of the plane where the wafer substrate 10 is located, and the device direction N3 is rotated counterclockwise until the included angle between the device direction N3 and the second crystal axis Y of the piezoelectric monocrystal material is the angle ∠A1, where the angle ∠A1 is equal to 170°.

Optionally, when the angle ∠B1 is equal to 0°, the second crystal axis Y is directed from the wafer substrate 10 to the piezoelectric layer 20 or from the piezoelectric layer 20 to the wafer substrate 10, and the device direction N3 is rotated clockwise until an included angle between the device direction N3 and the first crystal axis X is the angle ∠B2; or when the angle ∠B1 is equal to 0°, the second crystal axis Y is directed from the wafer substrate 10 to the piezoelectric layer 20 or from the piezoelectric layer 20 to the wafer substrate 10, and the device direction N3 is rotated counterclockwise until an included angle between the device direction N3 and the first crystal axis X is the angle ∠B2.

Specifically, this manner is to refine the above case (three), when the angle ∠B1 is equal to 0°, the second crystal axis Y of the piezoelectric monocrystal material is directed to inner or outer (that is, the second crystal axis Y is directed from the piezoelectric layer 20 to the wafer substrate 10 or from the wafer substrate 10 to the piezoelectric layer 20) of the plane where the wafer substrate 10 is located, and the device direction N3 may be rotated counterclockwise or clockwise until an included angle between the device direction N3 and the first crystal axis X of the piezoelectric monocrystal material is −20° to 20°. Exemplarily, referring to FIG. 10, in FIG. 10 (b), when the angle ∠B1 is equal to 0°, the second crystal axis Y of the piezoelectric monocrystal material is directed to inner or outer of the plane where the wafer substrate 10 is located, and the device direction N3 is rotated counterclockwise until the included angle between the device direction N3 and the first crystal axis X of the piezoelectric monocrystal material is-20°.

Figure 11:
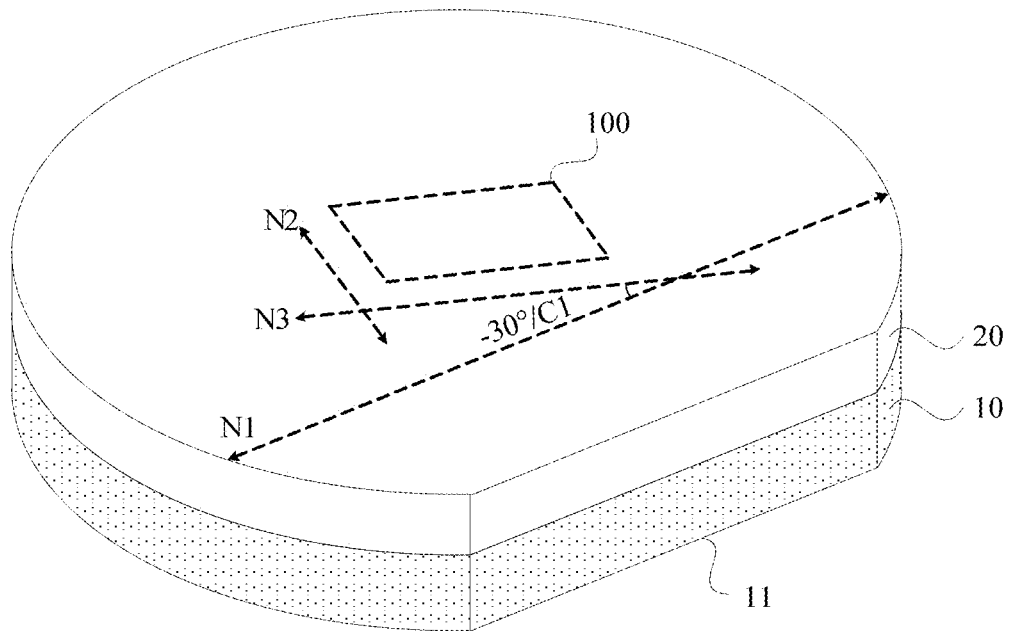
FIG. 11 is a structure view of combination between an interdigital electrode layer and a wafer substrate of a resonant device according to an embodiment of the present disclosure.
Figure 12:
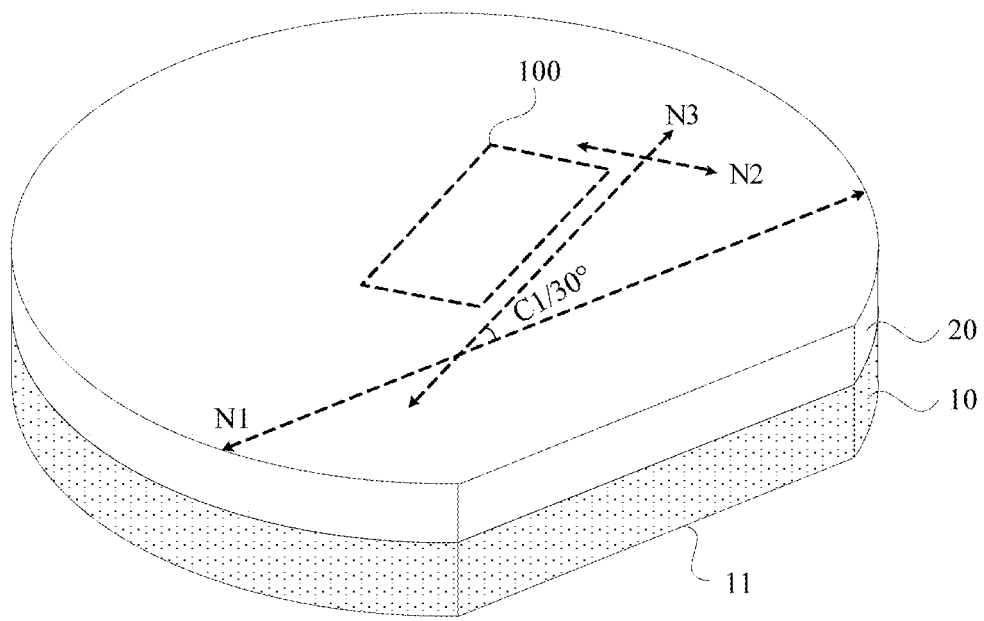
FIG. 12 is a structure view of combination between an interdigital electrode layer and a wafer substrate of another resonant device according to an embodiment of the present disclosure.

In the embodiment, not only the device direction N3 of the interdigital electrode layer 30 has a specific arrangement with respect to the piezoelectric monocrystal material of the piezoelectric layer 20, but also the device direction N3 of the interdigital electrode layer 30 may have a specific arrangement with respect to the wafer substrate 10. FIG. 11 is a structure view of combination between an interdigital electrode layer 30 and a wafer substrate 10 of a resonant device according to an embodiment of the present disclosure; and FIG. 12 is a structure view of combination between an interdigital electrode layer 30 and a wafer substrate 10 of another resonant device according to an embodiment of the present disclosure. A main positioning edge of the wafer substrate 10 is located on the first direction N1, an included angle between a propagation direction of an acoustic wave excited in the piezoelectric layer 20 and the first direction N1 is an angle ∠C1, where −30°≤∠C1≤30°, and the acoustic wave is excited by the electric field generated by the interdigital electrode layer 30 in the piezoelectric layer 20.

Specifically, the propagation direction of the acoustic wave excited in the piezoelectric layer 20 by the electric field generated by the interdigital electrode layer 30 in the piezoelectric layer 20 is also the device direction N3 in the embodiment, and the included angle between the device direction N3 and the first direction N1 is −30° to 30°. Exemplarily, referring to FIG. 11, FIG. 11 schematically shows a case where the included angle between the device direction N3 and the first direction N1 is −30°, referring to FIG. 1, FIG. 1 schematically shows a case where the included angle between the device direction N3 and the first direction N1 is 0°, and referring to FIG. 12, FIG. 12 schematically shows a case where the included angle between the device direction N3 and the first direction N1 is 30°.

The piezoelectric layer 20 generates mechanical stress and corresponding deformation under the action of the electric field applied by the interdigital electrode layer 30, and then a surface acoustic wave propagating along the device direction N3 is excited in the piezoelectric layer 20. Considering the anisotropy of the piezoelectric monocrystal material in the piezoelectric layer 20, the included angle between the device direction N3 and the first direction N1 is provided to be greater than or equal to −30° or less than or equal to 30° in the embodiment, thus achieving the relative positional relationship between a directions of the interdigital electrodes and the wafer substrate 10 to be adjusted, enhancing the piezoelectric effect generated by the piezoelectric layer 20 by further utilizing the maximum bulk elastic modulus of the piezoelectric monocrystal material, and increasing the electromechanical coupling coefficient of the resonant device, and enhancing the performance of the resonant device and increasing the working frequency of the resonant device.

Optionally, referring to FIGS. 2 and 3, the interdigital electrode layer 30 includes multiple first interdigital electrodes 310 and multiple second interdigital electrodes 320. The multiple first interdigital electrodes 310 are connected to a bus bar 311 located on a first side of the interdigital electrode layer, and the multiple first interdigital electrodes 310 extend from the first side of the interdigital electrode layer to a second side of the interdigital electrode layer along a second direction N2, where the first side is opposite to the second side. The multiple second interdigital electrodes 320 are connected to a bus bar 321 located on the second side of the interdigital electrode layer, and the multiple second interdigital electrodes 320 extend from the second side of the interdigital electrode layer to the first side of the interdigital electrode layer along the second direction N2. Vertical projections of the multiple first interdigital electrodes 310 on the piezoelectric layer alternate with vertical projections of the multiple second interdigital electrodes 320 on the piezoelectric layer 20, and the multiple first interdigital electrodes 310 and the multiple second interdigital electrodes 320 are insulated from each other.

Specifically, the multiple first interdigital electrodes 310 and the multiple second interdigital electrodes 320 both are metal electrodes. The materials of the first interdigital electrodes 310 and the second interdigital electrode 320 may include any one or a combination of titanium (Ti), silver (Ag), aluminum (Al), copper (Cu), copper-aluminum alloy (AlCu), chromium (Cr), ruthenium (Ru), molybdenum (Moly) and tungsten (W). Each first interdigital electrode 310 is connected to a common electrode, i.e., the bus bar 311, and each second interdigital electrode is connected to a common electrode, i.e., the bus bar 321. The width of each first interdigital electrode 310 may be the same or different, and the width of each second interdigital electrode 320 may also be the same or different. When the resonant device 100 is working, a power signal Vin is inputted into the multiple first interdigital electrodes 310 through the bus bar 311, and a ground signal GND is inputted into the multiple second interdigital electrodes 320 through the bus bar 321, so that the interdigital electrode layer 30 can apply the electric field in a direction perpendicular to the multiple first interdigital electrodes 310 and the multiple second interdigital electrodes 320 in the piezoelectric layer 20, that is, the electric field in the device direction N3. In this manner, the electric field in the device direction N3 is generated in the entire thickness direction of the piezoelectric layer 20, the surface acoustic wave propagating along the device direction N3 (that is, the longitudinally polarized acoustic wave) is excited, and the surface acoustic wave is converted into a corresponding electrical signal output to achieve filtering.

Figure 13:
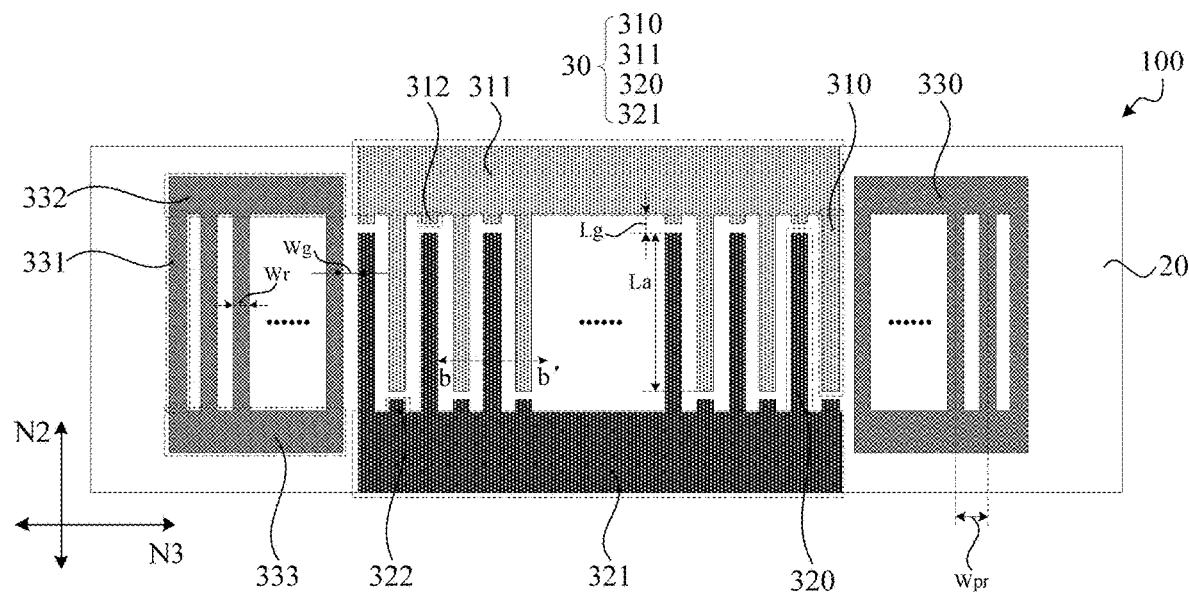
FIG. 13 is a top view of another resonant device according to an embodiment of the present disclosure.

FIG. 13 is a top view of another resonant device according to an embodiment of the present disclosure and is specifically another top view of the resonant device 100 in FIG. 1. As shown in FIG. 13, optionally, the interdigital electrode layer 30 is provided to include multiple first dummy interdigital electrodes 312 and multiple second dummy interdigital electrodes 322. Each of the multiple first dummy interdigital electrodes 312 is located between respective adjacent ones of the multiple first interdigital electrodes 310 and is connected to the bus bar 311, and the multiple first dummy interdigital electrodes 312 extend from the first side to the second side along the second direction N2. Each of the multiple second dummy interdigital electrodes 322 is located between respective adjacent ones of the multiple second interdigital electrodes 320 and is connected to the bus bar 321, and the multiple second dummy interdigital electrodes 322 extend from the second side to the first side along the second direction N2. The multiple first dummy interdigital electrodes 312, the multiple second dummy interdigital electrodes 322, the multiple first interdigital electrodes 310 and the multiple second interdigital electrodes 320 are insulated from each other. Materials of the multiple first dummy interdigital electrodes 312 and the multiple second dummy interdigital electrodes 322 may be the same as the materials of the multiple first interdigital electrodes 310 and the multiple second interdigital electrodes 320. In the embodiment, the first dummy interdigital electrodes 312 and the second dummy interdigital electrodes 322 are provided to form dummy short fingers (for example, the first dummy interdigital electrodes 312 form dummy short fingers disconnected from the corresponding second interdigital electrodes 320, and the second dummy interdigital electrodes 322 form dummy short fingers disconnected from the corresponding first interdigital electrodes 310) disconnected from the interdigital electrodes so that the surface acoustic wave excited by the resonant device is reflected when propagating to the first dummy interdigital electrodes 312 and the second dummy interdigital electrodes 322, thereby confining the surface acoustic wave to the inside of the resonant device in the second direction N2, and further improving the energy reflectivity of the resonant device and suppressing unwanted stray responses.

Figure 14:
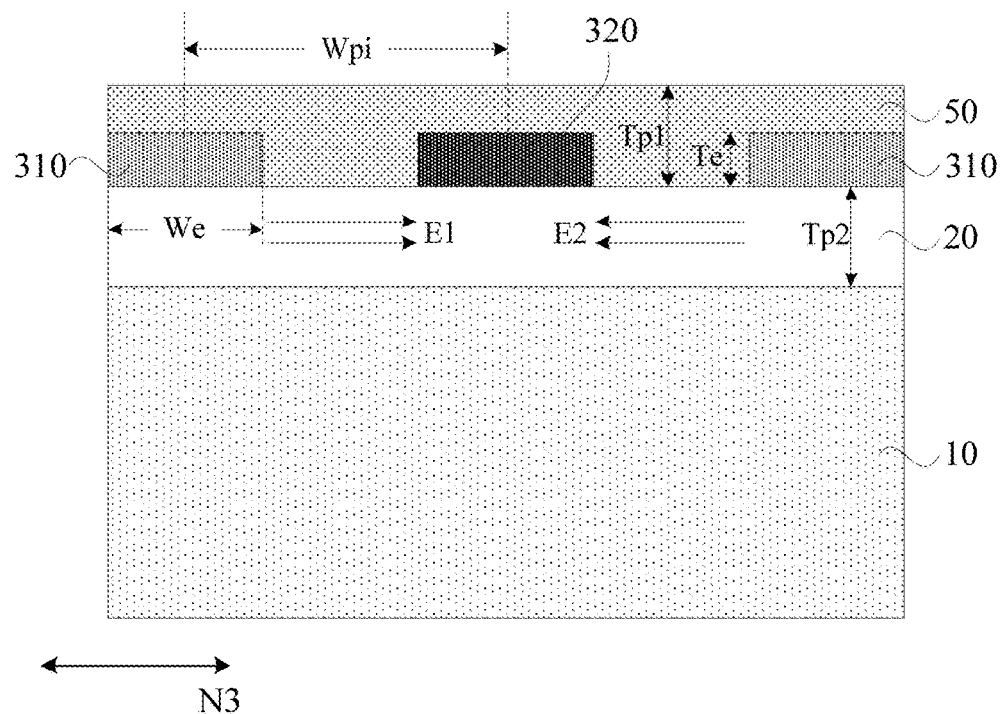
FIG. 14 is a sectional view of another resonant device according to an embodiment of the present disclosure.

FIG. 14 is a sectional view of another resonant device according to an embodiment of the present disclosure and is specifically a sectional view of the resonant device shown in FIG. 13 taken along a line bb'. Referring to FIGS. 2, 13 and 14, optionally, the resonant device 100 further includes two acoustic reflectors 330. The two acoustic gratings 330 are located on the side of the piezoelectric layer 20 facing away from the wafer substrate 10, and the two acoustic gratings 330 are respectively provided on two sides of the interdigital electrode layer 30 along the second direction N2 and are insulated from the interdigital electrode layer 30. Each acoustic grating 330 includes multiple metal strips 331 along the second direction N2. A pitch Wpr between adjacent metal strips 331 is greater than 0.1 times a pitch Wpi between a first interdigital electrode 310 and a second interdigital electrode 320 adjacent to the first interdigital electrode 310 and is less than 10 times the pitch Wpi between the first interdigital electrode 310 and the second interdigital electrode 320 adjacent to the first interdigital electrode 310. The pitch Wpr between the adjacent metal strips 331 may be a distance between centers of the adjacent metal strips 331 in a third direction (i.e., the device direction N3), and the pitch Wpi between the first interdigital electrode 310 and the second interdigital electrode 320 adjacent to the first interdigital electrode 310 may be a distance between a center of the first interdigital electrode 310 in the third direction (i.e., the device direction N3) and a center of the second interdigital electrode 320 adjacent to the first interdigital electrode 310 in the third direction (i.e., the device direction N3). The third direction (that is, the device direction N3) is parallel to the wafer substrate 10 and perpendicular to the second direction N2. A width Wr of each metal strip 33 in the third direction (that is, the device direction N3) is greater than 0.1 times the pitch Wpr between the adjacent metal strips 331 and is less than 0.9 times the pitch Wpr between the adjacent metal strips 331. An interval Wg between the interdigital electrode layer 30 and one of the multiple metal strips 331 adjacent to the interdigital electrode layer is greater than ⅛ times the pitch Wpi between the first interdigital electrode 310 and the second interdigital electrode 320 adjacent to the first interdigital electrode 310 and is less than 10 times the pitch Wpi between the first interdigital electrode 310 and the second interdigital electrode 320 adjacent to the first interdigital electrode 310.

Specifically, a material of the two acoustic gratings 330 may be the same as or different from the materials of the multiple first interdigital electrodes 310 and the multiple second interdigital electrodes 320. Two ends of each of the metal strips 331 in each acoustic grating 330 are connected to a bus 332 and a bus 333, respectively. The bus bars connected to the multiple first interdigital electrodes 310 and the multiple second interdigital electrodes 320 may be connected to or may not be connected to the buses connected the metal strips 331 in the two acoustic gratings 330. FIGS. 2 and 13 both show a case where the bus bars connected to the interdigital electrodes are not connected to the buses connected to the metal strips in the acoustic gratings. In the embodiment, the two acoustic gratings 330 are provided on two sides of the interdigital electrode layer respectively, so that the surface acoustic wave propagating to the outside of the acoustic gratings 330 from two sides of the resonant device can be reduced based on the diffraction principle of acoustic wave, helping to confine the surface acoustic wave to the inside of the resonant device in the third direction N3, and further improving the energy conversion efficiency between electric energy and mechanical energy of the resonant device.

The interval Wg between the interdigital electrode layer 30 and the adjacent metal strip 331 refers to the interval between the metal strip 331 closest to the interdigital electrodes in the acoustic grating and the first interdigital electrode 310 or the second interdigital electrode 320 closest to the acoustic grating in the interdigital electrode layer. FIG. 14 schematically shows a case where the width of each first interdigital electrode 310 and the width of each second interdigital electrode 320 in the third direction (i.e., the device direction N3) are both We. In the embodiment, the pitch Wpr between adjacent metal strips 331 is provided to be 0.1 Wpi<Wpr<10 Wpi, the width Wr of each metal strip 331 in the third direction (i.e., the device direction N3) is provided to be 0.1 Wpr<Wr<0.9 Wpr and the interval Wg between the interdigital electrode layer 30 and the adjacent metal strip 331 is provided to be ⅛Wpi<Wg<10 Wpi, which helps to reduce the acoustic wave diffraction of the resonant device generated by the acoustic gratings, thereby further reducing the surface acoustic wave propagating to the outside of the acoustic grating 330 from both sides of the resonant device, helping to confine the surface acoustic wave to the inside of the resonant device in the third direction (i.e., the device direction N3), and further improving the energy conversion efficiency between the electrical energy and the mechanical energy of the resonant device.

Referring to FIGS. 13 and 14, based on the above embodiments, optionally, the width We of each first interdigital electrode 310 and the width We of each second interdigital electrode 320 in the third direction (i.e., the device direction N3) are provided to be 250 nm<We<1 μm, so that the electromechanical coupling coefficient of the resonant device is adjusted by adjusting the widths of the interdigital electrodes, thereby enhancing the performance of the resonant device and improving the working frequency of the resonant device.

Referring to FIGS. 13 and 14, optionally, the total number of first interdigital electrodes 310 and second interdigital electrodes 320 is provided to be greater than 50, so that the electromechanical coupling coefficient of the resonant device is adjusted by adjusting the total number of interdigital electrodes, thereby enhancing the performance of the resonant device and improving the working frequency of the resonant device. Optionally, the total number of metal strips 331 in the two acoustic gratings 330 is provided to be greater than 50, thereby reducing the surface acoustic wave propagating to the outside of the acoustic gratings 330 from two sides of the resonant device, helping to confine the surface acoustic wave to the inside of the resonant device in the third direction (i.e., the device direction N3), and further improving the energy conversion efficiency between electric energy and mechanical energy of the resonant device.

Referring to FIGS. 13 and 14, optionally, the length in which the first interdigital electrodes 310 and the second interdigital electrodes 320 overlap in the second direction N2 is provided to be 15 µm<La<200 µm, and a distance between each of the second interdigital electrodes 320 and the bus bar 311 (i.e., a distance between each of the first interdigital electrodes and the bus bar 321) is provided to be 250 µm<Lg<5 µm, so that the electromechanical coupling coefficient of the resonant device is adjusted, thereby enhancing the performance of the resonant device and improving the working frequency of the resonant device.

Referring to FIGS. 13 and 14, optionally, the pitch between the first interdigital electrode 310 and the second interdigital electrode 320 adjacent to the first interdigital electrode 310 is provided to be 500 nm<Wpi<2 µm. f=v/(2*Wpi), where f is the working frequency of the resonant device, and v is the wave speed of the surface acoustic wave propagating in the resonant device. Therefore, in a case of constant wave speed, the smaller the pitch Wpi between the first interdigital electrode 310 and the second interdigital electrode 320, the larger the working frequency of the resonant device. In the embodiment, the pitch between the first interdigital electrode 310 and the second interdigital electrode 320 is adjusted to improve the working frequency of the resonant device.

Referring to FIGS. 13 and 14, optionally, the thickness of the first interdigital electrodes 310 and the thickness of the second interdigital electrodes 320 in a direction perpendicular to the wafer substrate 10 are provided to be 50 nm<Te<200 nm, the thickness of a passivation layer 50 between a surface on a side of the piezoelectric layer 20 facing away from the wafer substrate 10 and a surface of a side on the passivation layer 50 facing away the piezoelectric layer 20 is provided to be 100 nm<Tp1<600 nm, and the thickness of the piezoelectric layer 20 in the direction perpendicular to the wafer substrate 10 is provided to be 300 nm<Tp2<1 µm. Thus, the thickness of the interdigital electrodes, the thickness of the passivation layer and the thickness of the piezoelectric layer are adjusted to adjust the electromechanical coupling coefficient of the resonant device, thereby enhancing the performance of the resonant device and improving the working frequency of the resonant device.

Based on the above embodiments, optionally, one or more dielectric layers may also be provided between the piezoelectric layer and the wafer substrate to adjust the electromechanical coupling coefficient of the resonant device, thereby improving the performance of the resonant device.

Figure 15:
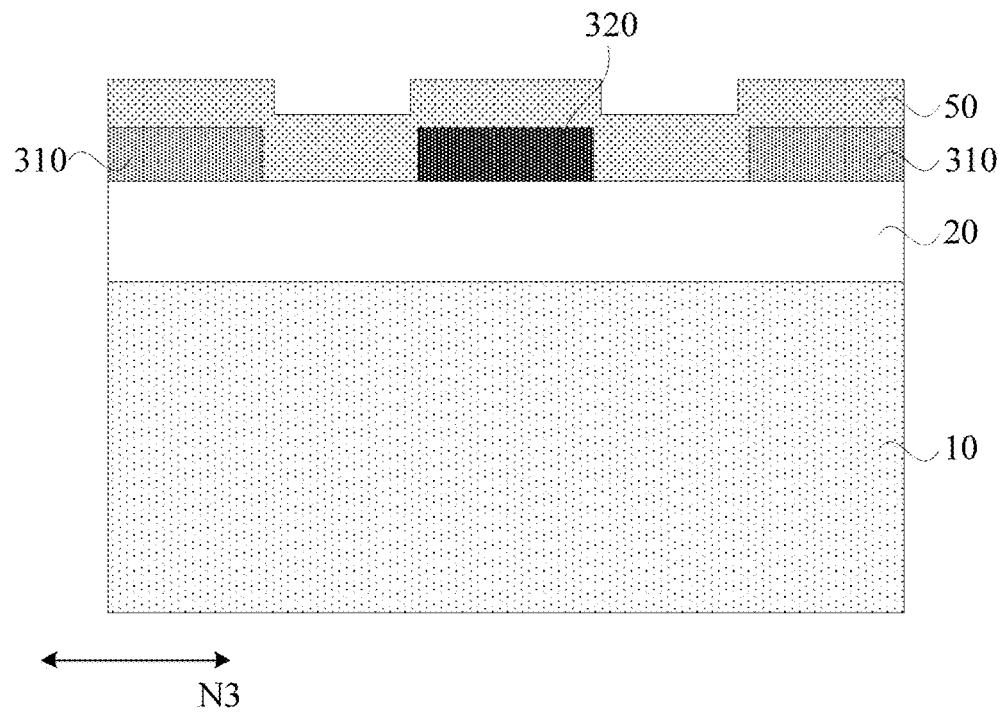
FIG. 15 is a sectional view of another resonant device according to an embodiment of the present disclosure.

FIG. 15 is a sectional view of another resonant device according to an embodiment of the present disclosure and is specifically another sectional view of the resonant device shown in FIG. 13 taken along a line bb'. As shown in FIGS. 3, 14 and 15, optionally, the resonant device further includes a passivation layer 50 located on the side of the interdigital electrode layer 30 facing away from the wafer substrate 10, and the passivation layer 50 covers the interdigital electrode layer 30.

Specifically, the passivation layer 50 may be made of silicon dioxide ($SiO_2$) or silicon nitride ($SiN_x$). In the embodiment, the interdigital electrode layer 30 is protected by providing the passivation layer 50 to cover the interdigital electrode layer 30 to isolate humidity and oxidation in the environment. In the case where the passivation layer 50 is formed on the side of the interdigital electrode layer 30 facing away from the wafer substrate 10, an upper surface on the side of the passivation layer 50 facing away from the wafer substrate 10 may be made flat, or an undulation of the upper surface of the passivation layer 50 may be made consistent with a topography of an upper surface of the interdigital electrode layer.

Figure 16:
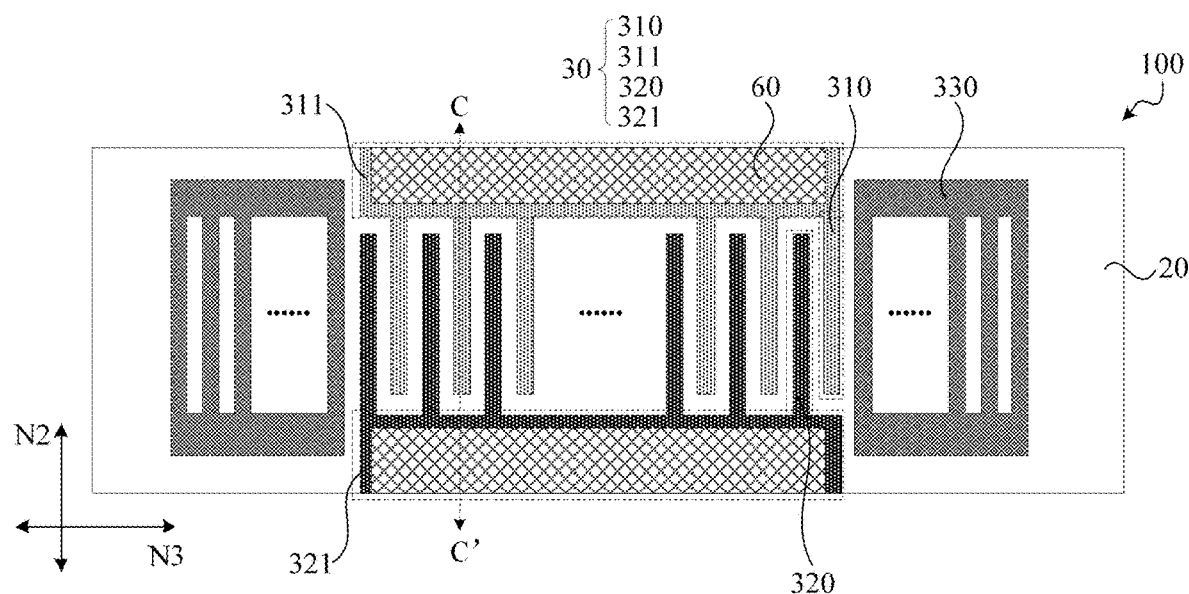
FIG. 16 is a top view of another resonant device according to an embodiment of the present disclosure.
Figure 17:
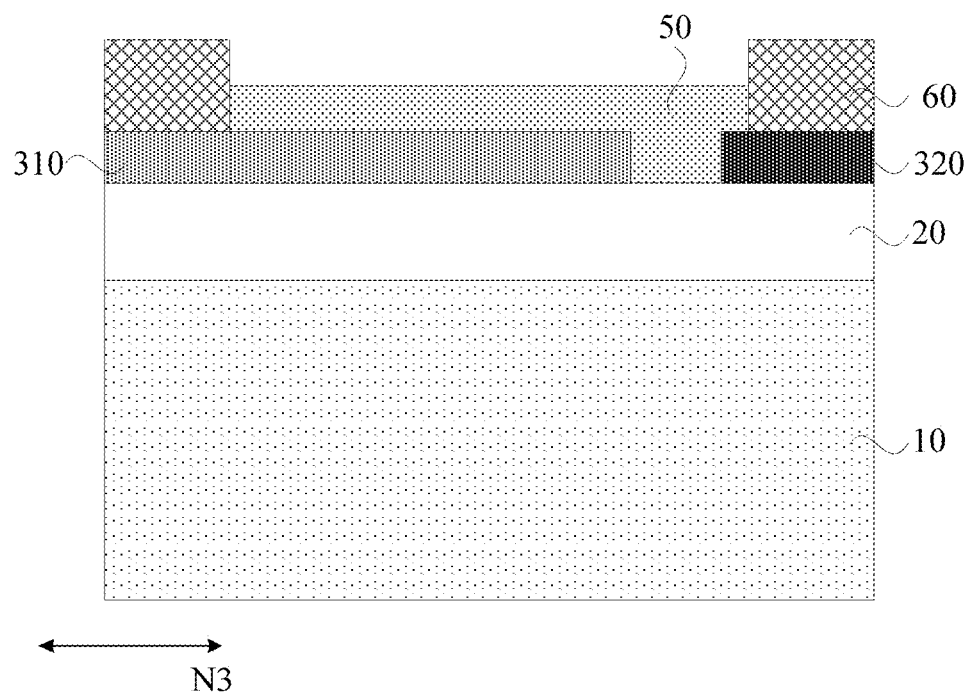
FIG. 17 is a sectional view of another resonant device according to an embodiment of the present disclosure.

FIG. 16 is a top view of another resonant device according to an embodiment of the present disclosure and is specifically another top view of the resonant device 100 in FIG. 1. FIG. 17 is a sectional view of another resonant device according to an embodiment of the present disclosure and is specifically another sectional view of the resonant device shown in FIG. 16 taken along a line CC'. Referring to FIGS. 16 and 17, optionally, the resonant device further includes a metal layer 60. The metal layer 60 is located on a side of the interdigital electrode layer 30 facing away from the wafer substrate 10, and the metal layer 60 covers at least a partial region of the bus bar 311 on the first side of the interdigital electrode layer 30 and covers at least a partial region of the bus bar 321 on the second side of the interdigital electrode layer 30.

Specifically, the material of the metal layer 60 may include any one or a combination of titanium (Ti), silver (Ag), aluminum (Al), copper (Cu), copper-aluminum alloy (AlCu), chromium (Cr), ruthenium (Ru), molybdenum (Moly) and tungsten (W). In the embodiment, the metal layer 60 is provided to cover at least a partial region of the bus bar 311 and covering at least a partial region of the bus bar 321, which helps to cause the surface acoustic wave excited by the resonant device to be reflected when propagating to the metal layer 60, thereby confining the surface acoustic wave to the inside of the resonant device in the second direction N2. At the same time, the metal layer 60 may also be exposed to the surface of the packaged resonant device 100, so that the interdigital electrodes are connected to the electrical signal through the metal layer and the bus bar covered by the metal layer.

Figure 18:
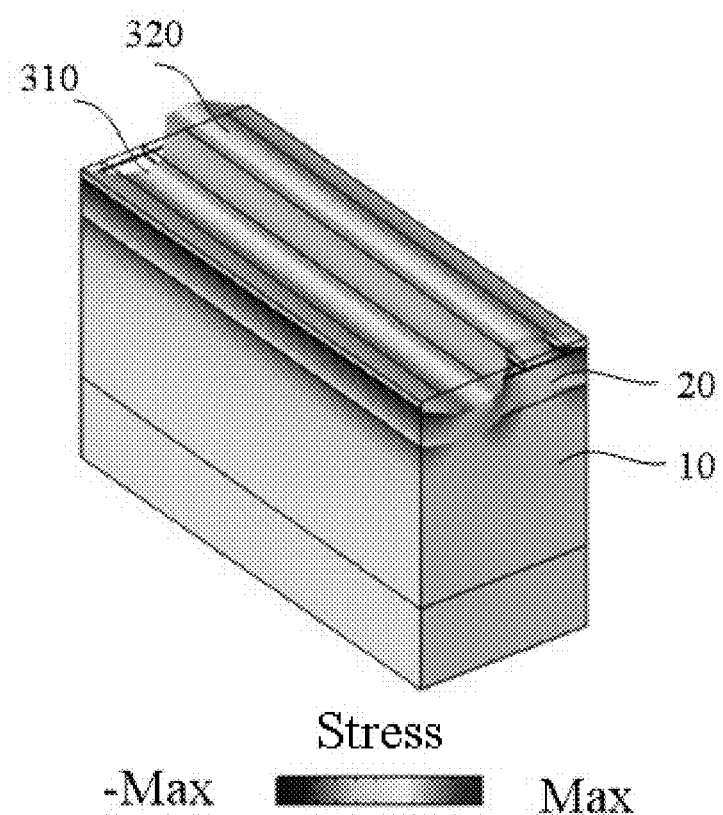
FIG. 18 is a schematic diagram of stress distribution of a resonant device according to an embodiment of the present disclosure.

FIG. 18 is a schematic diagram of stress distribution of a resonant device according to an embodiment of the present disclosure. FIG. 18 schematically shows the stress distribution of various film layers of the resonant device shown in FIG. 13 under the action of the electric field. Referring to FIGS. 13, 14 and 18, the mechanical stress generated by the resonant device under the action of the electric field mainly exists in the piezoelectric layer 20, the interdigital electrode layer and the passivation layer 50, and only a small amount of stress exists in the wafer substrate 10. Since the power signal Vin is inputted into the first interdigital electrodes 310 and the ground signal GND is inputted into the second interdigital electrodes 320, each second interdigital electrode 320 and the two first interdigital electrodes 310 on both sides of the each second interdigital electrode 320 may generate opposite electric fields E1 and E2 in the entire thickness direction of the piezoelectric layer 20, respectively, and accordingly, the stress generated by the resonant device in the piezoelectric layer 20 reaches an extreme value. As shown in FIG. 18, the stresses in the piezoelectric layer 20 corresponding to positions between the first interdigital electrodes 310 and the second interdigital electrodes 320 reach a maximum value (near Max), and the stresses in the piezoelectric layer 20 at positions corresponding to the first interdigital electrode 310 and the second interdigital electrode 320 reach a minimum value (near Max).

Figure 19:
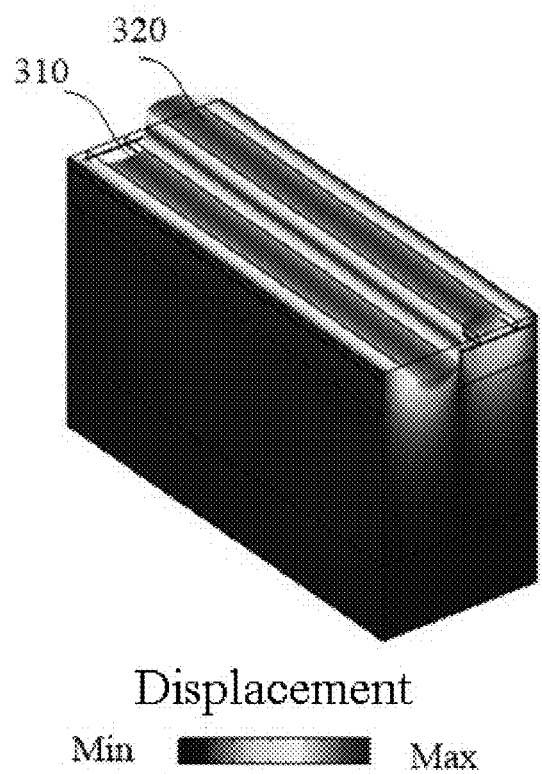
FIG. 19 is a schematic diagram of displacement distribution of a resonant device according to an embodiment of the present disclosure.

FIG. 19 is a schematic diagram of vibration displacement distribution of a resonant device according to an embodiment of the present disclosure. FIG. 19 schematically shows the vibration displacement distribution of various film layers of the resonant device shown in FIG. 13 under the action of the electric field. Referring to FIGS. 13, 14 and 19, the vibration displacement caused by standing waves generated in the propagation of the acoustic wave in the resonant device mainly exists in the piezoelectric layer 20, the interdigital electrode layer and the passivation layer 50, and only a small amount of displacements exists in the wafer substrate 10. As shown in FIG. 19, the vibration displacements in the piezoelectric layer 20 corresponding to the positions between the first interdigital electrodes 310 and the second interdigital electrodes 320 reach a minimum value (near Min), and the vibration displacements in the piezoelectric layer 20 at the positions corresponding to the first interdigital electrodes 310 and the second interdigital electrodes 320 in the piezoelectric layer 20 reach a maximum value (near Max).

Figure 20:
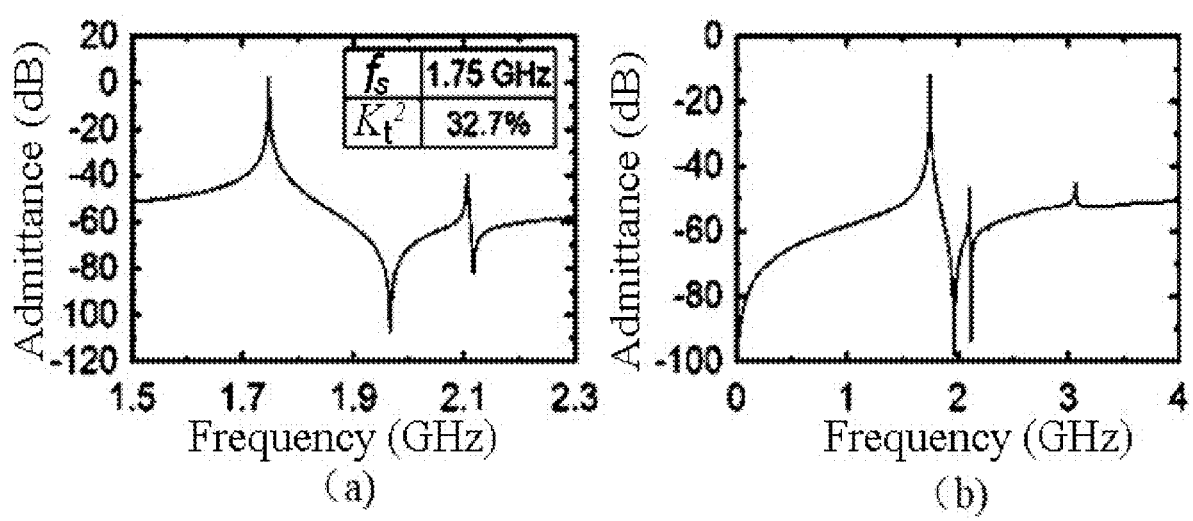
FIG. 20 is a graph showing an admittance characteristic of a resonant device according to an embodiment of the present disclosure.

FIG. 20 is a graph showing an admittance characteristic of a resonant device according to an embodiment of the present disclosure, and may specifically be graphs respectively showing admittance characteristics obtained by performing a simulation experiment on the resonant devices shown in FIGS. 13 and 14. As shown in FIG. 20 (a), using eigenfrequency to simulate, the resonant frequency (i.e., the working frequency) of the resonant device provided by the embodiment of the disclosure is 1.75 GHZ, the corresponding electromechanical coupling coefficient $K^2_t$ can reach 32.7%, and as shown in FIG. 20 (b), FIG. 20 (b) is a wide frequency response in FIG. 20 (a), and under the same parameters, the working frequency is 0.1 GHz to 4 GHz. It can be seen that the scheme of the embodiment helps to improve the electromechanical coupling coefficient and the operating frequency of the resonant device, and helps to determine the preferred structure and size of the resonant device according to the thickness and width of various film layers of the resonant device, the size and position of the interdigital electrodes and the size and position of the acoustic grating relative to the interdigital electrodes.

The embodiment of the present disclosure provides an acoustic filter including the resonant device described in any of the above solutions. The acoustic filter provided by the embodiment of the present disclosure involves the same inventive concept as the resonant device provided in any of the above solutions, and both of them can achieve the same technical effect, and the repeated description will not be repeated here.

It is to be noted that the preceding are merely preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A resonant device, comprising a wafer substrate, a piezoelectric layer and an interdigital electrode layer,
   wherein a main positioning edge of the wafer substrate is located in a first direction; the piezoelectric layer is located on a side of the wafer substrate and comprises a piezoelectric monocrystal material; the piezoelectric monocrystal material comprises a first crystal axis, a second crystal axis and a third crystal axis, and the first crystal axis, the second crystal axis, and the third crystal axis are perpendicular to each other, the interdigital electrode layer is located on a side of the piezoelectric layer facing away from the wafer substrate, the interdigital electrode layer comprises two groups of interdigital electrodes extending along a second direction, and the interdigital electrode layer is configured to generate an electric field in the piezoelectric layer; and a direction of the electric field generated by the interdigital electrode layer in the piezoelectric layer is a device direction, and the device direction is parallel to the wafer substrate and perpendicular to the second direction; and
   wherein the first crystal axis is perpendicular to the wafer substrate, and an included angle formed between the device direction and the second crystal axis is an angle ∠A1, wherein −30°≤∠A1≤10°, or 170°≤∠A1≤210°, or −210°≤∠A1≤−170°; or wherein the first crystal axis and the third crystal axis are both perpendicular to a vertical direction of the wafer substrate, and the second crystal axis and the third crystal axis are both perpendicular to the device direction, an included angle formed between the second crystal axis and a direction perpendicular to the wafer substrate is an angle ∠B1, wherein −200≤∠B1≤40°, and an included angle formed between the device direction and the first crystal axis is an angle ∠B2, wherein −20°≤∠B2≤20°.

2. The resonant device of claim 1, wherein the first crystal axis is directed from the wafer substrate to the piezoelectric layer.

3. The resonant device of claim 1, wherein the first crystal axis is directed from the piezoelectric layer to the wafer substrate.

4. The resonant device of claim 1, wherein the second crystal axis comprises a positive direction and a negative direction extending along opposite directions; and
   when ∠B1 is equal to 0°, the positive direction of the second crystal axis is directed from the wafer substrate to the piezoelectric layer or from the piezoelectric layer to the wafer substrate.

5. The resonant device of claim 1, wherein an included angle formed between a propagation direction of an acoustic wave excited in the piezoelectric layer and the first direction is an angle ∠C1, wherein −30°≤∠C1≤30°, and the acoustic wave is excited by the electric field generated by the interdigital electrode layer in the piezoelectric layer.

6. The resonant device of claim 1, wherein the interdigital electrode layer comprises a plurality of first interdigital electrodes and a plurality of second interdigital electrodes;
   wherein the plurality of first interdigital electrodes are connected to a bus bar located on a first side of the interdigital electrode layer, and the plurality of first interdigital electrodes extend from the first side of the interdigital electrode layer to a second side of the interdigital electrode layer along the second direction, wherein the first side is opposite to the second side, wherein the plurality of second interdigital electrodes are connected to a bus bar located on the second side of the interdigital electrode layer, and the plurality of second interdigital electrodes extend from the second side of the interdigital electrode layer to the first side of the interdigital electrode layer along the second direction; and wherein vertical projections of the plurality of first interdigital electrodes on the piezoelectric layer alternate with vertical projections of the plurality of second interdigital electrodes on the piezoelectric layer and the plurality of first interdigital electrodes and the plurality of second interdigital electrodes are insulated from each other.

7. The resonant device of claim 6, further comprising a metal layer and acoustic gratings; wherein the metal layer is located on a side of the interdigital electrode layer facing away from the wafer substrate, and the metal layer covers at least a partial region of the bus bar on the first side of the interdigital electrode layer and covers at least a partial region of the bus bar on the second side of the interdigital electrode layer;

the acoustic gratings are located on the side of the piezoelectric layer facing away from the wafer substrate, and the acoustic gratings are respectively provided on two sides of the interdigital electrode layer along the second direction and are insulated from the interdigital electrode layer.

8. An acoustic filter, comprising a resonant device, wherein the resonant device comprises a wafer substrate, a piezoelectric layer and an interdigital electrode layer, wherein a main positioning edge of the wafer substrate is located in a first direction; the piezoelectric layer is located on a side of the wafer substrate and comprises a piezoelectric monocrystal material; the piezoelectric monocrystal material comprises a first crystal axis, a second crystal axis and a third crystal axis, and the first crystal axis, the second crystal axis and the third crystal axis are perpendicular to each other; the interdigital electrode layer is located on a side of the piezoelectric layer facing away from the wafer substrate, the interdigital electrode layer comprises two groups of interdigital electrodes extending along a second direction, and the interdigital electrode layer is configured to generate an electric field in the piezoelectric layer; and a direction of the electric field generated by the interdigital electrode layer in the piezoelectric layer is a device direction, and the device direction is parallel to the wafer substrate and perpendicular to the second direction; and wherein the first crystal axis is perpendicular to the wafer substrate, and an included angle formed between the device direction and the second crystal axis is an angle $\angle A1$, wherein $-30°\le\angle A1\le10°$, or $170°\le\angle A1\le210°$, or $-210°\le\angle A1\le-170°$; or, wherein the first crystal axis and the third crystal axis are both perpendicular to a vertical direction of the wafer substrate, and the second crystal axis and the third crystal axis are both perpendicular to the device direction, an included angle formed between the second crystal axis and a direction perpendicular to the wafer substrate is an angle $\angle B1$, wherein $-20°\le\angle B1\le40°$, and an included angle formed between the device direction and the first crystal axis is an angle $\angle B2$, wherein $-20°\le\angle B2\le20°$.

9. The acoustic filter of claim 8, wherein the first crystal axis is directed from the wafer substrate to the piezoelectric layer.

10. The acoustic filter of claim 8, wherein the first crystal axis is directed from the piezoelectric layer to the wafer substrate.

11. The acoustic filter of claim 8, wherein the second crystal axis comprises a positive direction and a negative direction extending along opposite directions, and when $\angle B1$ is equal to $0°$, the positive direction of the second crystal axis is directed from the wafer substrate to the piezoelectric layer or from the piezoelectric layer to the wafer substrate.

12. The acoustic filter of claim 8, wherein an included angle formed between a propagation direction of an acoustic wave excited in the piezoelectric layer and the first direction is an angle $\angle C1$, wherein $-30°\le\angle C1\le30°$, and the acoustic wave is excited by the electric field generated by the interdigital electrode layer in the piezoelectric layer.

13. The acoustic filter of claim 8, wherein the interdigital electrode layer comprises a plurality of first interdigital electrodes and a plurality of second interdigital electrodes;

wherein the plurality of first interdigital electrodes are connected to a bus bar located on a first side of the interdigital electrode layer, and the plurality of first interdigital electrodes extend from the first side of the interdigital electrode layer to a second side of the interdigital electrode layer along the second direction, wherein the first side is opposite to the second side;

wherein the plurality of second interdigital electrodes are connected to a bus bar located on the second side of the interdigital electrode layer, and the plurality of second interdigital electrodes extend from the second side of the interdigital electrode layer to the first side of the interdigital electrode layer along the second direction; and wherein vertical projections of the plurality of first interdigital electrodes on the piezoelectric layer alternate with vertical projections of the plurality of second interdigital electrodes on the piezoelectric layer and the plurality of first interdigital electrodes and the plurality of second interdigital electrodes are insulated from each other.

14. The acoustic filter of claim 13, further comprising a metal layer and acoustic gratings; wherein the metal layer is located on a side of the interdigital electrode layer facing away from the wafer substrate, and the metal layer covers at least a partial region of the bus bar on the first side of the interdigital electrode layer and covers at least a partial region of the bus bar on the second side of the interdigital electrode layer;

the acoustic gratings are located on the side of the piezoelectric layer facing away from the wafer substrate, and the acoustic gratings are respectively provided on two sides of the interdigital electrode layer along the second direction and are insulated from the interdigital electrode layer.

15. The resonant device of claim 7, wherein one of the acoustic gratings located on each of the two sides of the interdigital electrode layer comprises a plurality of metal strips along the second direction;

a pitch between adjacent ones of the plurality of metal strips is greater than 0.1 times a pitch between one of the plurality of first interdigital electrodes and one of the plurality of second interdigital electrodes and is less than 10 times the pitch between the one of the plurality of first interdigital electrodes and the one of the plurality of second interdigital electrodes, wherein the one of the plurality of first interdigital electrodes is adjacent to the one of the plurality of second interdigital electrodes.

16. The resonant device of claim 15, wherein a width of each of the plurality of metal strips in a third direction is greater than 0.1 times the pitch between the adjacent ones of the plurality of metal strips and is less than 0.9 times the pitch between the adjacent ones of the plurality of metal strips; and
an interval between the interdigital electrode layer and one of the plurality of metal strips which is adjacent to the interdigital electrode layer is greater than ⅛ times the pitch between the one of the plurality of first interdigital electrodes and the one of the plurality of second interdigital electrodes and is less than 10 times the pitch between the one of the plurality of first interdigital electrodes and the one of the plurality of second interdigital electrodes, wherein the third direction is parallel to the wafer substrate and is perpendicular to the second direction.

17. The acoustic filter of claim 14, wherein one of the acoustic gratings located on each of the two sides of the interdigital electrode layer comprises a plurality of metal strips along the second direction;
a pitch between adjacent ones of the plurality of metal strips is greater than 0.1 times a pitch between one of the plurality of first interdigital electrodes and one of the plurality of second interdigital electrodes, and is less than 10 times the pitch between the one of the plurality of first interdigital electrodes and the one of the plurality of second interdigital electrodes, wherein the one of the plurality of first interdigital electrodes is adjacent to the one of the plurality of second interdigital electrodes.

18. The acoustic filter of claim 17, wherein a width of each of the plurality of metal strips in a third direction is greater than 0.1 times the pitch between the adjacent ones of the plurality of metal strips and is less than 0.9 times the pitch between the adjacent ones of the plurality of metal strips; and
an interval between the interdigital electrode layer and one of the plurality of metal strips which is adjacent to the interdigital electrode layer is greater than ⅛ times the pitch between the one of the plurality of first interdigital electrodes and the one of the plurality of second interdigital electrodes, and is less than 10 times the pitch between the one of the plurality of first interdigital electrodes and the one of the plurality of second interdigital electrodes, wherein the third direction is parallel to the wafer substrate and is perpendicular to the second direction.

* * * * *